(12) United States Patent
Kasai et al.

(10) Patent No.: US 8,897,631 B2
(45) Date of Patent: Nov. 25, 2014

(54) ANNEALING APPARATUS

(75) Inventors: Shigeru Kasai, Nirasaki (JP); Hiroyuki Miyashita, Nirasaki (JP); Tomohiro Suzuki, Nirasaki (JP); Masatake Yoneda, Nirasaki (JP); Kazuhiro Ooya, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 855 days.

(21) Appl. No.: 12/864,792

(22) PCT Filed: Jan. 19, 2009

(86) PCT No.: PCT/JP2009/050625
§ 371 (c)(1),
(2), (4) Date: Oct. 25, 2010

(87) PCT Pub. No.: WO2009/096248
PCT Pub. Date: Aug. 6, 2009

(65) Prior Publication Data
US 2011/0033175 A1 Feb. 10, 2011

(30) Foreign Application Priority Data

Jan. 28, 2008 (JP) .................................. 2008-016475
May 8, 2008 (JP) .................................. 2008-122117
Sep. 25, 2008 (JP) .................................. 2008-245176

(51) Int. Cl.
*F27D 11/12* (2006.01)
*H01L 21/67* (2006.01)
*H01L 21/324* (2006.01)
*H01L 21/268* (2006.01)

(52) U.S. Cl.
CPC .... *H01L 21/67109* (2013.01); *H01L 21/67115* (2013.01); *H01L 21/324* (2013.01); *H01L 21/268* (2013.01)
USPC ..................................... 392/407; 362/249.06

(58) Field of Classification Search
USPC .................. 219/407, 402, 411; 118/724, 725; 372/34–36; 362/346, 360, 361, 353; 359/864
See application file for complete search history.

(56) References Cited

U.S. PATENT DOCUMENTS 4,806,456 A  2/1989  Katoh
5,660,461 A *  8/1997  Ignatius et al. ............... 362/241

(Continued)

FOREIGN PATENT DOCUMENTS

JP    H4-207020    7/1992
JP    2003 77852   3/2003

(Continued)

OTHER PUBLICATIONS

International Search Report for International Application No. PCT/JP2009/056962, mailed Jun. 2, 2009.

(Continued)

*Primary Examiner* — Dana Ross
*Assistant Examiner* — Frederick Calvetti
(74) *Attorney, Agent, or Firm* — Oblon, Spivak, McClelland, Maier & Neustadt, L.L.P.

(57) ABSTRACT

An annealing apparatus includes heating sources provided to face a wafer W, the heating sources having LEDs emitting lights to the wafer; light-transmitting members for transmitting the lights emitted from the LEDs; and cooling members made of aluminum and provided to directly contact with the heating sources, respectively. The heating sources include a plurality of LED arrays having supporters made of AlN, each having one surface on which the LEDs are adhered by using a silver paste; and other surface on which thermal diffusion members made of copper are adhered by using a solder. The LED arrays are fixed to the cooling member by using screws via a silicone grease.

29 Claims, 16 Drawing Sheets

(56) References Cited

U.S. PATENT DOCUMENTS

| | | | |
|---|---|---|---|
| 6,121,579 A | 9/2000 | Aoki et al. | |
| 6,923,557 B2 * | 8/2005 | Jahn et al. | 362/382 |
| 6,998,777 B2 * | 2/2006 | Suehiro et al. | 313/512 |
| 7,015,422 B2 * | 3/2006 | Timans | 219/390 |
| 7,645,056 B1 * | 1/2010 | Mills et al. | 362/294 |
| 7,946,727 B2 * | 5/2011 | Lee | 362/249.06 |
| 8,041,197 B2 | 10/2011 | Kasai et al. | |
| 8,222,074 B2 * | 7/2012 | Lazarev | 438/99 |
| 8,231,251 B2 * | 7/2012 | Eng et al. | 362/346 |
| 8,246,900 B2 * | 8/2012 | Kasai et al. | 266/250 |
| 2001/0027969 A1 * | 10/2001 | Takahashi et al. | 219/390 |
| 2002/0030047 A1 * | 3/2002 | Shao et al. | 219/390 |
| 2003/0228772 A1 * | 12/2003 | Cowans | 438/795 |
| 2004/0026400 A1 * | 2/2004 | Ptak | 219/390 |
| 2006/0011336 A1 * | 1/2006 | Frul | 165/185 |
| 2006/0137822 A1 * | 6/2006 | Cowans | 156/345.51 |
| 2007/0053166 A1 * | 3/2007 | Hwang et al. | 361/717 |
| 2007/0121086 A1 | 5/2007 | Imade | |
| 2008/0187299 A1 | 8/2008 | Shimizu et al. | |
| 2010/0038833 A1 * | 2/2010 | Kasai et al. | 266/250 |
| 2010/0300359 A1 * | 12/2010 | Armour et al. | 118/724 |

FOREIGN PATENT DOCUMENTS

| | | |
|---|---|---|
| JP | 2003-077857 | 3/2003 |
| JP | 2006-059931 | 3/2006 |
| JP | 2007 116072 | 5/2007 |
| JP | 2008-060560 | 3/2008 |
| JP | 2008 227435 | 9/2008 |
| JP | 4486885 | 6/2010 |
| KR | 1990-0001238 | 3/1990 |
| WO | WO 2004/015348 | 2/2004 |
| WO | WO 2008/016116 | 2/2008 |
| WO | WO 2008/029742 | 3/2008 |

OTHER PUBLICATIONS

International Search Report for International Application No. PCT/JP2009/050625, mailed Apr. 14, 2009.

* cited by examiner

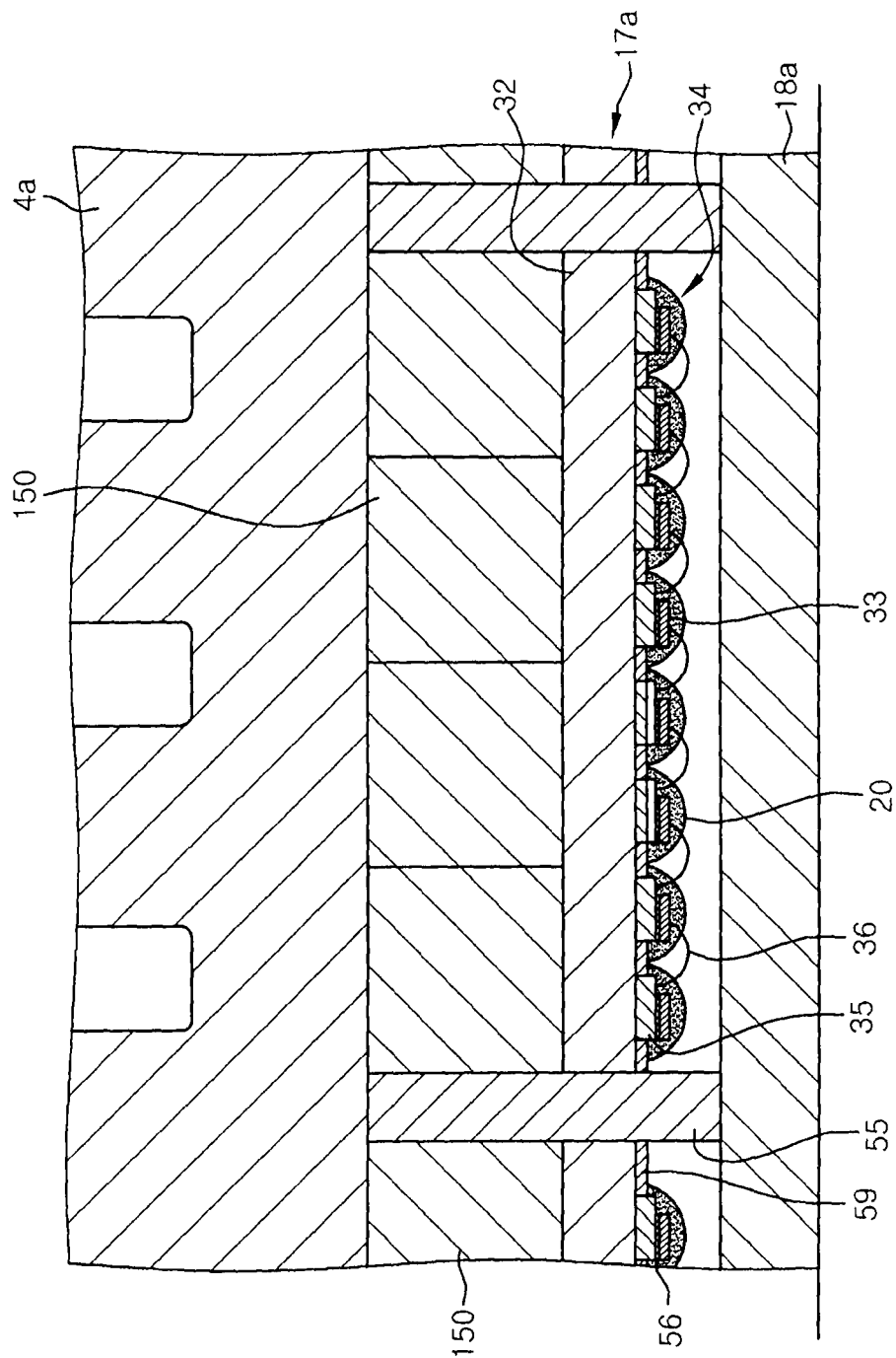

ANNEALING APPARATUS

FIELD OF THE INVENTION

The present invention relates to an annealing apparatus which performs an annealing process by emitting a light from a light emitting element such as a light emitting diode to a semiconductor wafer or the like.

BACKGROUND OF THE INVENTION

In a semiconductor device manufacturing process, a target substrate to be processed, i.e., a semiconductor wafer (hereinafter, simply referred to as a wafer), is subjected to various heat treatments such as a film forming process, an oxidation/diffusion process, a quality modification process, and an annealing process. Especially, in the annealing process after ion implantation, it is required to increase and decrease the temperature rapidly so as to minimize the diffusion, in response to the demand for the high speed and high integration of semiconductor device. There has been disclosed an annealing apparatus capable of increasing and decreasing the temperature rapidly, the annealing apparatus employing light emitting diodes (LED) as a heating source (see, e.g., Japanese Patent Application Publication No. 2005-536045).

In the case of employing LEDs as the heating source of the annealing apparatus, it is necessary to generate a lot of energy to increase the temperature rapidly and, thus, it is required to mount the LEDs with high density.

However, it is known that the emission amount of an LED is reduced as the temperature of the LED is increased by the heat radiated from the LED. Moreover, when LEDs are mounted with high density, if the LEDs are significantly affected by the heat radiated from themselves (e.g., the remaining portion of the supplied energy which is not emitted as lights), it becomes difficult to obtain sufficient emission amount from the LEDs. For that reason, it is suggested to cool the LEDs so as to suppress the reduction of the emission amount caused by the heat radiated from the LEDs. However, a large scale cooling device is required to effectively cool the high-density mounted LEDs and, resultantly, the maintenance thereof becomes an issue.

Further, lights are emitted from side surfaces of the LED as well as a facing surface thereof that faces a target wafer to be heated. A side length of the LED is in the range of about 0.3 to 1 mm, and a thickness thereof is in the range of about 0.2 mm. In addition, the area of 4 side surfaces thereof is wider than that of the facing surface thereof. Accordingly, the efficiency of obtaining lights may be reduced.

SUMMARY OF THE INVENTION

In view of the above, the present invention provides an annealing apparatus employing a light emitting elements such as a light emitting diode (LED) serving as a heating source, in which the light emitting element can be efficiently cooled without decreasing the maintenance thereof.

The present invention also provides an annealing apparatus capable of efficiently obtaining a light emitted from a light emitting element such as an LED.

In accordance with a first aspect of the present invention, there is provided an annealing apparatus. The annealing apparatus includes a processing space for accommodating therein a target substrate to be processed; a heating source provided to face at least one side surface of the target substrate, the heating source including a plurality of light emitting elements that emit lights to the target substrate; a light-transmitting member provided to correspond to the heating source, lights emitted from the light emitting elements traveling through the light-transmitting member; a cooling member for supporting one side of the light-transmitting member, opposite to the processing space, the cooling member being provided to be directly brought into contact with the heating source and the cooling member being made of aluminum or aluminum alloy; a cooling unit for cooling the cooling member by using a cooling medium; a gas exhaust unit for exhausting the processing space; and a processing gas supply unit for supplying a processing gas to the processing space, where the heating source includes a plurality of light emitting element arrays each having a supporter having one surface on which the light emitting elements are adhered by using a high thermal conductive adhesive substance, the supporter being made of an high thermal conductive insulating material, and a thermal diffusion member adhered to the other surface of the supporter by using a high thermal conductive adhesive substance, the thermal diffusion member being made of copper; and the light emitting element arrays are fixed to the cooling member by using a high thermal conductive adhesive substance.

In accordance with the first aspect of the present invention, the cooling member is made of aluminum or aluminum alloy to reduce the weight of the cooling member. Copper is employed as a material of the thermal diffusion member. The light emitting elements are attached to the supporter by using the high thermal conductive adhesive substance. The rear surface of the supporter is adhered to the thermal diffusion member by using the high thermal conductive adhesive material. The side of the light emitting array, facing the thermal diffusion member, is fixed to the cooling member via the high thermal conductive paste. With such configuration, the adhesion parts have significantly reduced thermal resistance and the sufficient thermal conductivity. Accordingly, the cold heat can quickly be accumulated in the thermal diffusion member and the LEDs can be sufficiently cooled by using the accumulated cold heat. As a result, it is possible to efficiently cool the light emitting elements while sufficiently maintaining the maintenance thereof.

In the first aspect of the present invention, a solder may be employed as the adhesive substance for adhering the supporter to the thermal diffusion member. Alternatively, a carbon sheet may be used as the adhesive substance for adhering the supporter to the thermal diffusion member, the carbon sheet in which a plurality of vapor deposition carbon fibers is oriented in the thickness direction in a base resin made of a thermoplastic resin. In this case, the vapor deposition carbon fibers preferably have a carbon nano tube structure.

In accordance with a second aspect of the present invention, there is provided an annealing apparatus. The annealing apparatus includes a processing space for accommodating therein a target substrate to be processed; a heating source provided to face at least one side surface of the target substrate, the heating source including a plurality of light emitting elements that emit lights to the target substrate; a light-transmitting member provided to correspond to the heating source, lights emitted from the light emitting elements traveling through the light-transmitting member; a cooling member for supporting one side of the light-transmitting member, opposite to the processing space, the cooling member being provided to be directly brought into contact with the heating source and the cooling member being made of aluminum or aluminum alloy; a cooling unit for cooling the cooling member by using a cooling medium; a gas exhaust unit for exhausting the processing space; and a processing gas supply unit for supplying a processing gas to the processing space, wherein the heating source includes a plurality of light emitting element arrays each having a supporter having one surface on which the light emitting elements are adhered by using a high thermal conductive adhesive substance, the supporter being made of an high thermal conductive insulating material, and a thermal diffusion member adhered to the other surface of the supporter, the thermal diffusion member being made of pyrolytic graphite; the light emitting element array and the light emitting element are constituted by unitizing; the light emitting element arrays are fixed to the cooling member by using a high thermal conductive adhesive substance; and the thermal diffusion member is adhered to the other surface of the supporter such that a thickness direction of the thermal diffusion member is set to be identical to a direction in which a thermal conductivity of the pyrolytic graphite is high.

In accordance with the second of the present invention, the cooling member is made of a less-weight aluminum or aluminum alloy. Less-weight pyrolytic graphite is employed as a material of the thermal diffusion member, the pyrolytic graphite having a high thermal conductive direction. The thermal diffusion member is adhered to the rear surface of the supporter such that the thickness direction of the thermal diffusion member is set to be identical to the high thermal conductive direction. The light emitting elements are attached to the supporter by using the high thermal conductive adhesive substance. The side of the thermal diffusion member of the light emitting array is fixed to the cooling member via the high thermal conductive paste by using screws. With such configuration, the thermal conductivity of the route through which the cold heat is transferred from the cooling member to the light emitting elements can be significantly increased and the cold heat can quickly be accumulated in the thermal diffusion member and the LEDs are sufficiently cooled by using the accumulated cold heat. As a result, it is possible to efficiently cool the light emitting elements while sufficiently maintaining the maintenance thereof.

In accordance with the second aspect of the present invention, the thermal diffusion member and the supporter may be adhered to each other by using an epoxy resin.

In the first and the second aspect of the present invention, the supporter may be made of aluminum nitride. Moreover, a space may be provided between the cooling member and the light-transmitting member, and the heating source may be provided in the space. Further, the annealing apparatus may include a power supply member connected to the power supply electrode via the cooling member to supply a power from a power supply to the power supply electrode.

Preferably, a silver paste is employed as the high thermal conductive substance for attaching the light emitting elements. Alternatively, a solder may be employed. The light emitting elements may be attached to an electrode made of the high thermal conductive material by using the adhesive substance. In this case, a plurality of layers including the adhesive substance may be provided between the light emitting elements and the electrode, serving as a thermal stress buffer structure. As such an above structure, one or more thermal stress buffer layers may be provided between the light emitting elements and the adhesive substance. Preferably, the adhesive substance is a solder and the thermal stress buffer layers are made of a material having a linear expansion coefficient that is in the range between those of the light emitting elements and the solder.

Preferably, the high thermal conductive adhesive substance interposed between the cooling member and the thermal diffusion member is a silicone grease.

In accordance with a third aspect of the present invention, there is provided an annealing apparatus. The annealing apparatus includes a processing space for accommodating therein a target substrate to be processed; a supporting member for supporting the target substrate in the processing space; a heating source provided to face at least one side surface of the target substrate on the supporting member, the heating source including a plurality of light emitting elements that emit lights to the target substrate; a light-transmitting member provided to correspond to the heating source, lights emitted from the light emitting elements traveling through the light-transmitting member; a gas exhaust unit for exhausting the processing space; and a processing gas supply unit for supplying a processing gas to the processing space, where the light source includes a supporter on which the light emitting elements are attached toward the target substrate, and a reflection layer is formed on the surface of the supporter where the light emitting elements are attached In accordance with the third of the present invention, since the reflection layer is provided on the surface of the supporter where the light emitting elements are attached, it is possible to effectively obtain a light reflected by the supporter and thus effectively obtain lights emitted from the light emitting elements.

In accordance with the third aspect of the present invention, the reflection layer preferably has a reflectivity of 0.8 or more. Moreover, a white-colored layer containing $TiO_2$ may be used as the reflection layer. Preferably, the reflection layer has a thickness of 0.8 μm or more. In addition, it is preferable that the light emitting elements are respectively covered lens layers. Finally, the lens layers may be made of a transparent resin, and the lens layers may have a hemisphere shape.

Preferably, the supporter is surrounded by reflection plates. Moreover, it is preferable that the supporter is arranged in plural number and the reflection plates are commonly provided at adjacent supporters. It is also preferable that the supports have a hexagonal shape having 3 sides where the reflection plates are provided and 3 other sides where no reflection plate is provided; and the supporters are arranged such that one side of one of the supporters where the reflection plate is provided is adjacent to one side of another of the supporters where no reflection plate is provided.

BRIEF DESCRIPTION OF THE DRAWINGS

FIG. 16 is an enlarged cross sectional view showing a heating source of an annealing apparatus in accordance with another embodiment of the present invention;

DETAILED DESCRIPTION OF THE EMBODIMENTS

Embodiments of the present invention will now be described with reference to the accompanying drawings which form a part hereof. Here, an annealing apparatus for annealing a wafer having a surface in which impurities are implanted is taken as an example.

Figure 1:
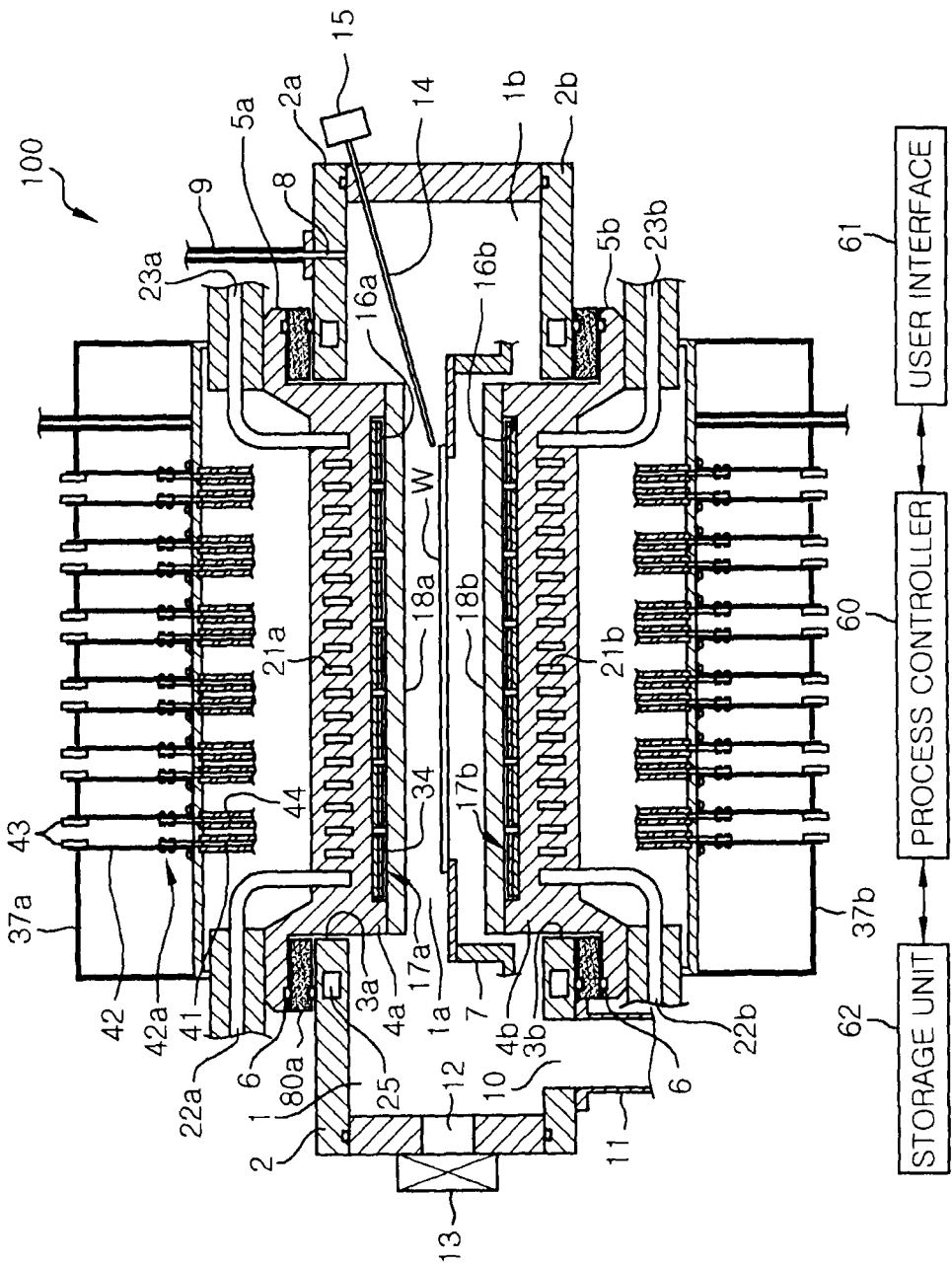
FIG. 1 is a cross sectional view showing a schematic structure of an annealing apparatus in accordance with a first embodiment of the present invention.
Figure 2:
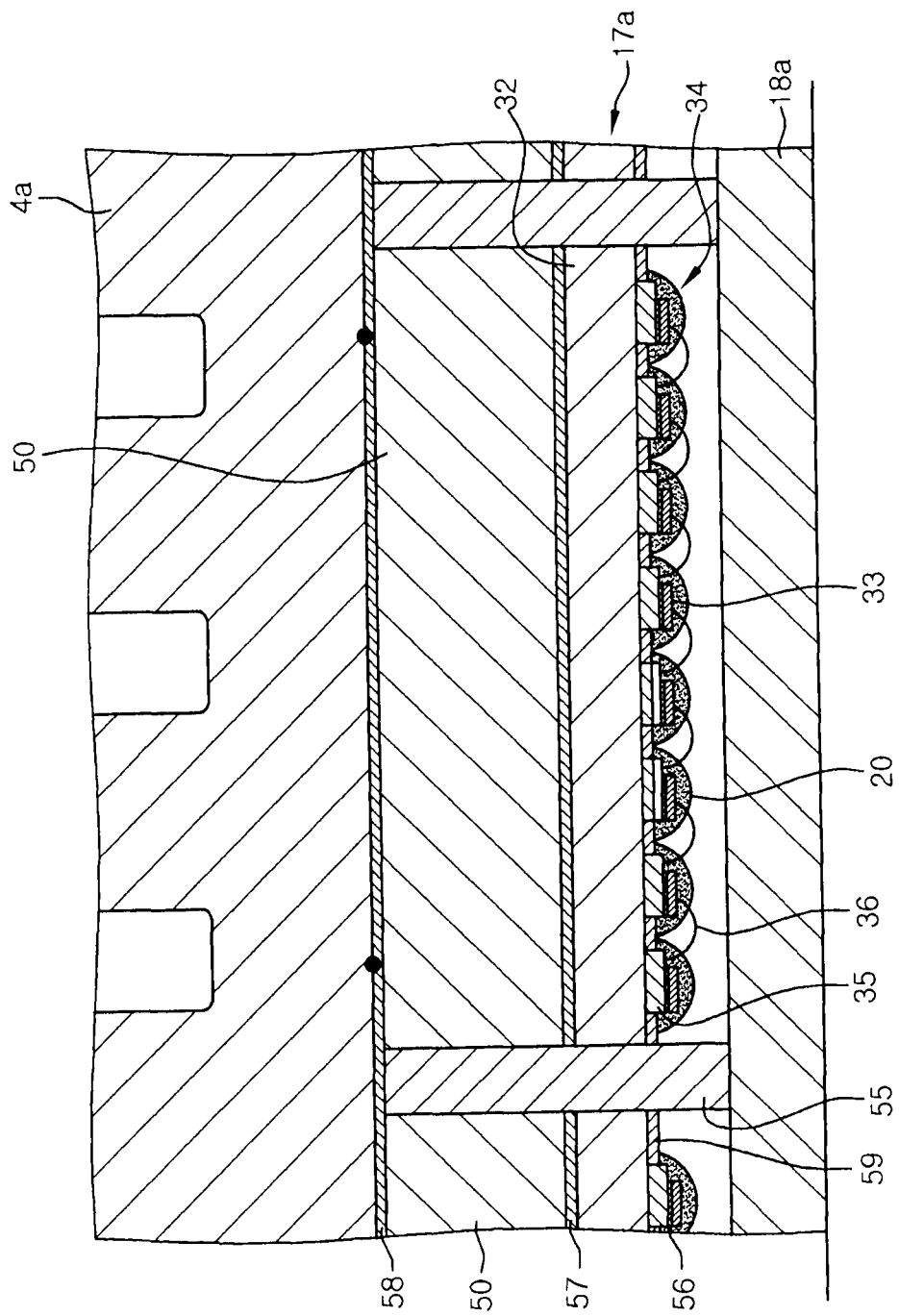
FIG. 2 is an enlarged cross sectional view showing a heating source of the annealing apparatus shown in FIG. 1.
Figure 3:
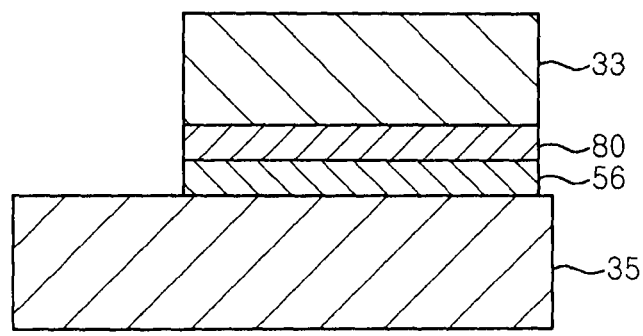
FIG. 3 is a cross sectional view showing an LED and an adhesive substance with a thermal stress buffer layer provided therebetween.
Figure 4:
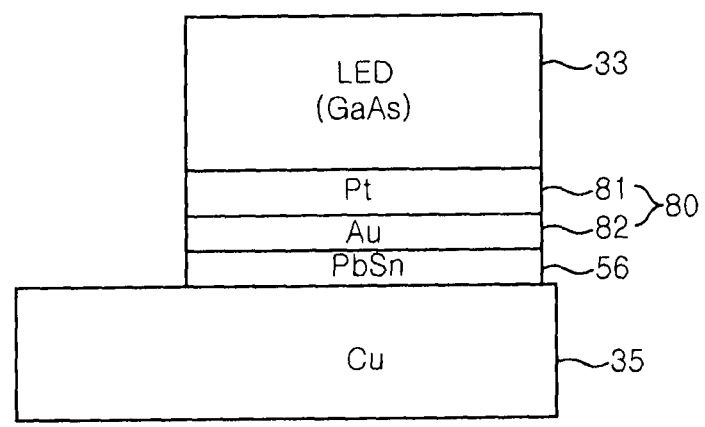
FIG. 4 is a cross sectional view showing an LED and an electrode with an adhesive substance and a thermal stress buffer layer provided therebetween.
Figure 9:
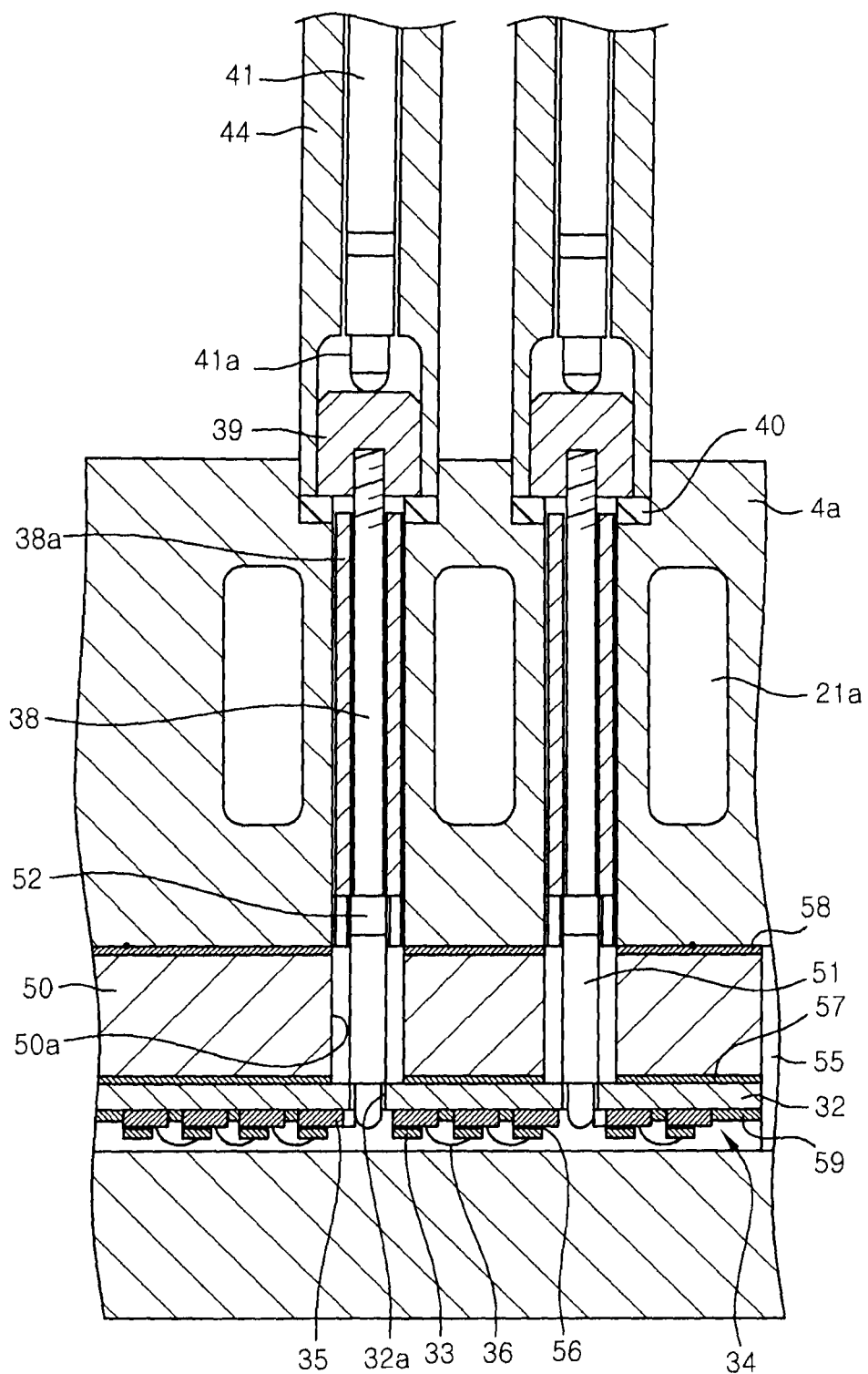
FIG. 9 is an enlarged cross sectional view showing a part for supplying a power to an LED of the annealing apparatus shown in FIG. 1.

FIG. 1 is a cross sectional view showing a schematic structure of an annealing apparatus in accordance with a first embodiment of the present invention. FIG. 2 is an enlarged cross sectional view showing a heating source of the annealing apparatus shown in FIG. 1. FIGS. 3 and 4 show other examples of adhesive parts of an LED. FIG. 9 is an enlarged cross sectional view showing a part for supplying a power to an LED of the annealing apparatus shown in FIG. 1.

The annealing apparatus 100 includes an airtight processing space 1 into which a wafer W is loaded. The processing space 1 includes a cylindrical annealing portion 1a in which the wafer W is arranged and a doughnut-shaped gas diffusion portion 1b provided outside the annealing portion 1a. The gas diffusion portion 1b is has a height greater than that of the annealing portion 1a, so that the processing space 1 has an H-shaped cross section. The gas diffusion portion 1b of the processing space 1 is defined by a chamber 2. The chamber 2 has an upper wall 2a and a lower wall 2b on which circular openings 3a and 3b are respectively formed corresponding to the annealing portion 1a. Respectively inserted into the circular openings 3a and 3b are cooling members 4a and 4b which are made of a high thermal conductive material, e.g., aluminum or aluminum alloy.

The cooling members 4a and 4b have flanges 5a and 5b, respectively. The flanges 5a and 5b are respectively supported by the upper wall 2a and the lower wall 2b of the chamber 2 through thermal insulation members 80a made of Ultem or like. Since the flanges 5a and 5b are cooled to a temperature of, e.g., −50° C. or lower as will be described later, the thermal insulation members 80a serve to minimize the heat transferred from the chamber 2.

Meanwhile, sealing members 6 are airtightly interposed between the flanges 5a and 5b and the thermal insulation members 80a; and between the thermal insulation members 80a and the upper and the lower wall 2a and 2b, respectively. Moreover, the portions of the cooling members 4a and 4b, which are exposed to the atmosphere, are covered with a thermal insulating material.

A supporting member 7 for horizontally supporting the wafer W is provided in an annealing portion 1a of the processing space 1. When the wafer W is changed, the supporting member 7 can be moved upwardly and downwardly by an elevating mechanism (not shown). Provided in a ceiling wall of the chamber 2 is a processing gas inlet opening 8 through which a predetermined processing gas is introduced from a processing gas supply unit (not shown). A processing gas line 9 is connected to the processing gas opening 8. A gas exhaust port 10 is provided at the lower wall of the chamber 2. Connected to the gas exhaust port 10 is a gas exhaust line 10 which is connected to a gas exhaust device (not shown). In addition, a loading/unloading port 12 through which the wafer W is loaded to and unloaded from the chamber 2 is provided at a side wall of the chamber 2. The loading/unloading port 12 can be opened and closed by a gate valve 13.

In the processing space 1, a temperature sensor 14 is provided to measure the temperature of the wafer W supported on the supporting member 7. Further, the temperature sensor 14 is connected to a measurement unit 15 provided outside the chamber 2, and a temperature detection signal is outputted from the measurement unit 15 to a process controller 60 to be described later.

On the surfaces of the cooling member 4a and 4b which face the wafer W supported by the supporting member 7, circular recessed portion 16a and 16b are formed to face the wafer W supported by the supporting member 7. Moreover, heating sources 17a and 17b including light emitting diodes (LED) are respectively arranged in the recessed portions 16a and 16b to be directly brought into contact with the cooling members 4a and 4b.

On the surfaces of the cooling members 4a and 4b which face the wafer W, light-transmitting member 18a and 18b through which lights are emitted to the wafer W from the LEDs mounted in the heating sources 17a and 17b are fixed by using screws to cover the respective recessed portions 16a and 16b. The light-transmitting members 18a and 18b are made of a material, e.g., quartz, which transmits a light emitted from an LED efficiently.

The cooling members 4a and 4b respectively include coolant flow paths 21a and 21b, through which a liquid cooling medium capable of cooling the cooling members 4a and 4b to a temperature of, e.g., about −50° C., flows. For example, a fluorine-based nonreactive liquid (Trademark name:, e.g., Florinert or Galden) is used as the liquid cooling medium. Coolant supply lines 22a and 22b and coolant discharge line 23a and 23b are connected to the coolant flow paths 21a and 21b of the cooling members 4a and 4b. Accordingly, it is possible to cool the cooling members 4a and 4b by circulating a coolant medium through the coolant flow paths 21a and 21b.

The chamber 2 further include a cooling water path 25 through which cooling water of a room temperature flows to prevent the excessive increase in temperature of the chamber 2.

As shown in the enlarged view of FIG. 2, the heating source 17a(17b) includes a supporter 32 made of an high thermal conductive insulating material, e.g., typically an AlN ceramic; and a plurality of LED arrays 34 constituted by a plurality of light emitting diodes (LED) 33 and a thermal diffusion member 50 made of a high thermal conductive material, e.g., copper, the LEDs being supported by the supporter 32 via electrodes 35. The electrodes 35 have a high conductivity and are patterned in the supporter 32, the electrodes 35 being made of gold-plating copper. The LEDs 33 are respectively adhered to the electrodes 35 by using a high thermal conductive adhesive substance 56.

It is preferable to employ a silver paste as the adhesive substance 56, the silver paste being a high thermal conductive substance having a high processability. Specifically, the silver paste is preferably a silver paste mostly made of an epoxy resin. In addition, it is more preferable to employ a silver paste mostly made of a heat-resistant silicon resin having a greater heat resistance in case the temperature therearound is higher than about 150° C.

However, a linear expansion coefficient of the silver paste is about $70 \times 10^{-6}/°$ C. which is greater than that ($5.7 \times 10^{-6}/°$ C.) of GaAs preferably used as a material of the LEDs 33 and that ($17.5 \times 10^{-6}/°$ C.) of copper used as a material of the electrodes 35. Accordingly, in case the silver paste is employed as the adhesive substance 56, a thermal stress may be generated and, thus, an adhered part may be damaged by being peeled off or the like when much current is supplied to output a high power from the LEDs 33. In this case, it is preferable to employ a substance having a small linear expansion coefficient, e.g., solder (PbSn), as the adhesive substance 56.

PbSn has a lower processability than that of the silver paste. However, the linear expansion coefficient of PbSn is about $24 \times 10^{-6}/°$ C. which is smaller than that of the silver paste and close to that of copper used as a material of the electrodes 35. Further, in the case of the silver paste, it is required to heat the adhesive substance 56 to a temperature of about 150° C. for the hardening and the residual stress becomes an issue. However, if PbSn is used, such problems can be solved.

As another solution to the thermal stress, the thermal expansion difference can be reduced by providing a multilayered structure having the adhesive substance 56 between the LEDs 33 and the electrodes 35. Specifically, as shown in FIG. 3, since the linear expansion coefficient of the LEDs 33 is small, it is preferable to provide a single or two or more thermal stress buffer layers 80 between the LEDs 33 and the adhesive substance 56, the thermal stress buffer layer having a linear expansion coefficient that is in the range between those of the LEDs 33 and the adhesive substance 56.

As shown in FIG. 4, a detailed structure for reducing the thermal stress can be realized by employing a solder as the adhesive substance 56, the solder having a linear expansion coefficient close to that of copper; and then employing a platinum layer 81 and a gold layer 82 as the thermal stress buffer layers 80, the platinum layer 81 having a linear expansion coefficient ($8.9 \times 10^{-6}/°$ C.) close to that of GaAs typically used as a material of the LEDs 33 and the gold layer 82 having a linear expansion coefficient ($14.2 \times 10^{-6}/°$ C.) close to that of the solder. The platinum layer 81 and the gold layer 82 may be formed by a thin film forming technique, e.g., sputtering.

To calculate a stress applied to an interfere of the LED 33 in a case A that the structure shown in FIG. 4 is used as a model, a stress simulation was carried out by comparing the case A with a case B that a structure employing a silver paste as the adhesive substance 56 is used as a model. Simulation conditions are set as follows. In addition, in the case B, the platinum layer and the gold layer of the case A were replaced with the silver paste.

(Simulation Conditions)
1. Layer thickness:
LED (GaAs): 200 μm
Platinum layer: 50 μm
Gold layer: 50 μm
Solder layer: 20 μm
Cu electrode layer: 100 μm
Silver paste: 120 μm
2. Method of forming platinum layer and gold layer Sputtering
3. Adhering conditions
Solder adhering temp.: 180° C. (Residual stress)
Silver paste hardening temp.: 150° C. (Residual stress)
4. Model
¼ model
5. Temperature
LED upper surface temp.: 50° C.
Copper electrode lower surface temp.: 20° C.
Further, the following Table 1 shows properties of matters.

TABLE 1

| Matters | Linear expansion coefficient ($10^{-6}/°$ C.) | Young's modulus (Pa) | Poisson's ratio |
|---|---|---|---|
| LED (GaAs) | 5.7 | $2.05 \times 10^{11}$ | 0.33 |
| Platinum | 8.9 | $1.68 \times 10^{11}$ | 0.377 |
| Gold | 14.2 | $7.80 \times 10^{9}$ | 0.44 |
| Solder (PbSn) | 2.4 | $1.90 \times 10^{10}$ | 0.37 |
| Silver paste | 70 | $3.00 \times 10^{9}$ | 0.37 |
| Cu electrode | 17.5 | $1.10 \times 10^{11}$ | 0.343 |

Under above conditions, the simulation was carried out by using "3GA" made by the PlassoTech Inc. As a result, the contact pressure applied to the interface of the LED was 480 MPa in the case of employing the silver paste, while the contact pressure was 70 MPa in the case of the structure shown in FIG. 4. This indicates that the stress (contact pressure) applied to the interface of the LED is reduced to ⅙ or less.

The supporter 32 and the thermal diffusion member 50 are adhered to each other by using a high thermal conductive adhesive substance 57. A high reliable solder can be employed as the high thermal conductive adhesive substance 57. Alternatively, the silver paste having a high thermal conductivity may be employed as the adhesive substance 57 to reduce the thermal resistance.

To obtain a high thermal conductivity by reducing the thermal resistance, it is preferable to employ as the adhesive substance 57 a carbon sheet in which a plurality of vapor deposition carbon fibers is oriented in the thickness direction in a base resin made of a thermoplastic resin. A polyamide may preferably be employed as the thermoplastic resin.

Moreover, it is preferable to use the vapor deposition carbon fibers having a diameter of about 3.5 to 10 μm and a filling fraction of about 7 to 75%, e.g., 40%. The vapor deposition carbon fibers have a graphite structure, e.g., typically a carbon nano tube structure, and the thermal conductivity of the vapor deposition carbon fibers in the lengthwise direction approaches about 1900 W/m·K. The carbon sheet filled with the vapor deposition carbon fibers has a significantly high thermal conductivity of 1000 to 1900 W/m·K in bulk. In the case of the carbon sheet filled with the vapor deposition carbon fibers at the filling fraction of 40%, the thermal conductivity becomes, e.g., about 750 W/m·K, which is substantially twice as much as that of pure copper.

As such a carbon sheet, "ATTA HM-1" made by the Browne Technology Inc. may be employed. If the carbon sheet is used as the adhesive substance 57, the thermoplastic resin, e.g., polyamide, serving as the base resin is softened by being heated to a temperature of about 180° C. to adhere the supporter 32 to the thermal diffusion member 50.

The thermal resistance in the case of employing the carbon sheet as the adhesive substance 57 was actually calculated. For the comparison, the thermal resistance in the case of employing the solder as the adhesive substance 57 was also calculated.

Figure 5:
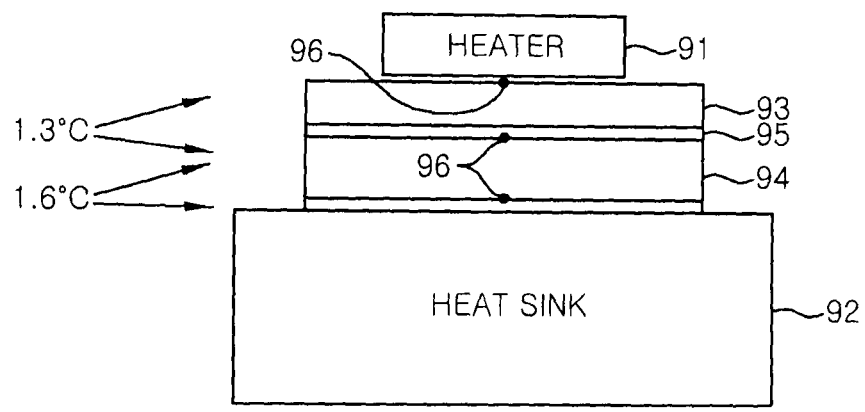
FIG. 5 shows a method for measuring a thermal resistance of a carbon sheet employed as an adhesive substance for adhering a supporter to a thermal diffusion member.

As shown in FIG. 5, interposed between a heater 91 and a heat sink 92 is a structure in which an AlN plate 93 having a thickness of 0.6 mm serving as the supporter and a copper plate 94 having a thickness of about 10 mm serving as the thermal diffusion member were adhered to each other by using a carbon sheet 95, e.g., "ATTA HM-1", having a thickness of 100 μm, "ATTA HM-1" being made by the Browne Technology Inc. Then, a thermocouple 96 is provided at total three locations, i.e., one location on the AlN plate 93 and two locations on an upper portion and a lower portion of the copper plate 94. Thereafter, the thermal resistance of the carbon sheet was calculated from a temperature difference A between the AlN plate 93 and the upper portion of the copper plate 94 and a temperature difference B between the upper and the lower portion of the copper plate 94.

Figure 6:
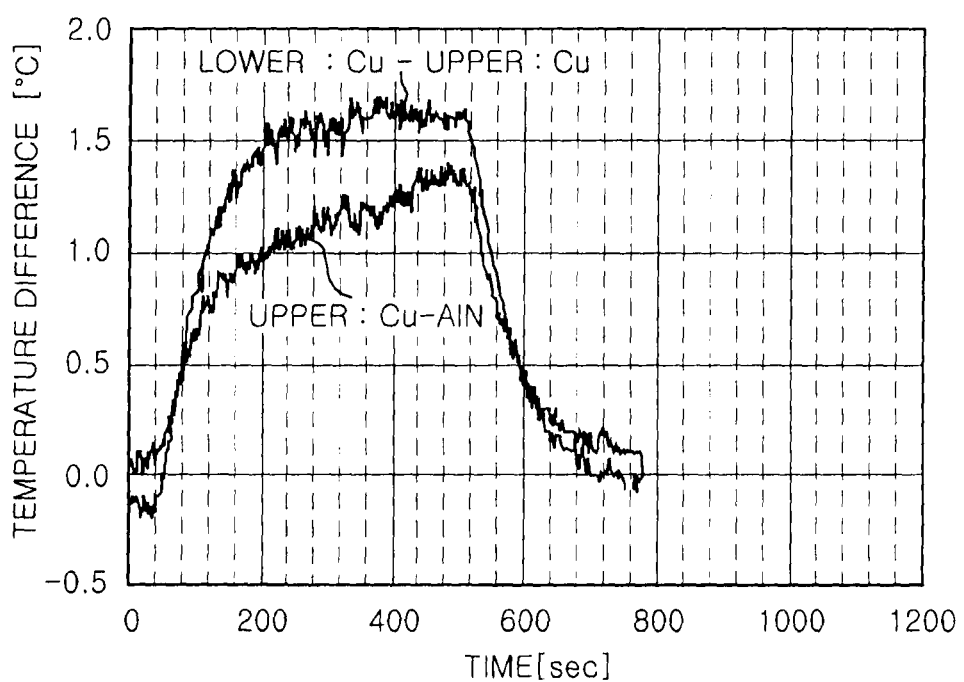
FIG. 6 is a chart showing a temperature deference between an AlN plate and an upper portion of a copper plate and a temperature deference between an upper and a lower portion of a copper plate to measure a thermal resistance of a carbon sheet.

FIG. 6 is a chart showing the temperature differences A and B. The temperature differences A and B were 1.3 and 1.6° C., respectively, as shown in FIG. 5. From the temperature differences A and B, the thermal resistance of the carbon sheet was calculated as 0.16 cm²·K/W, which is a significantly low value.

Figure 7:
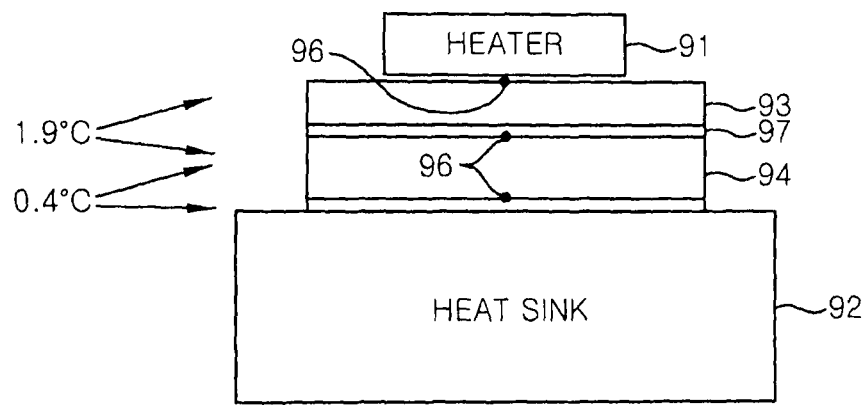
FIG. 7 shows a method for measuring a thermal resistance of a solder employed as an adhesive substance for adhering a supporter to a thermal diffusion member.

As shown in FIG. 7, interposed between the heater 91 and the heat sink 92 is a structure in which the AlN plate 93 having a thickness of about 0.6 mm serving as the supporter and the copper plate 94 having a thickness of about 9 mm serving as the thermal diffusion member are adhered to each other by using a solder 97 having a thickness of 100 μm. The thermal resistance of the solder was calculated from the temperature differences A and B by using the similar method to that shown in FIG. 5.

Figure 8:
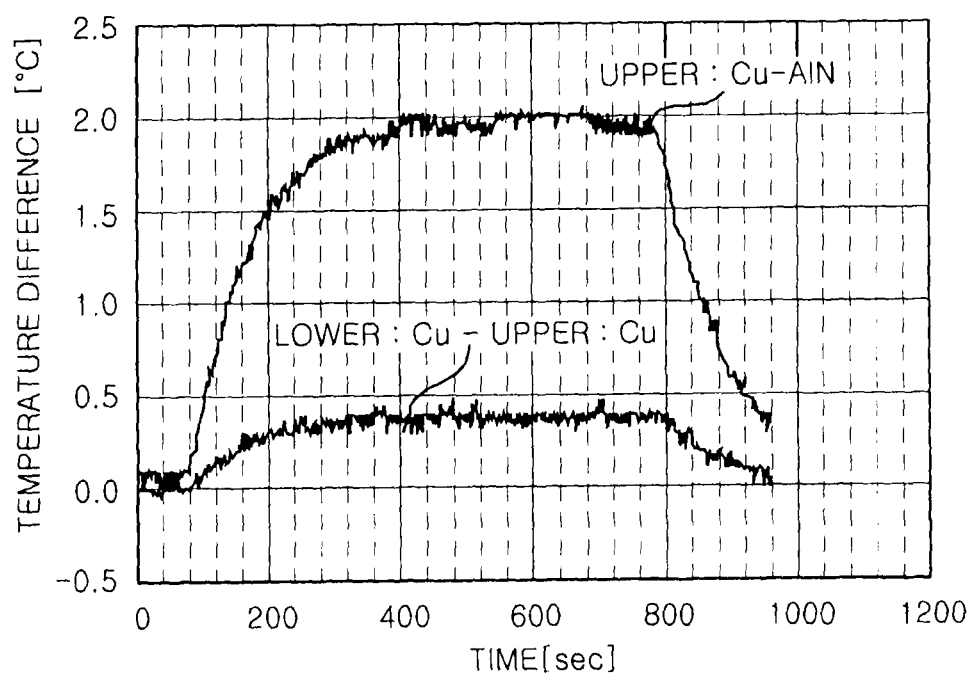
FIG. 8 is a chart showing a temperature deference between an AlN plate and an upper portion of a copper plate and a temperature deference between an upper and a lower portion of a copper plate to measure a thermal resistance of a solder.

FIG. 8 is a chart showing the temperature differences A and B. The temperature differences A and B were 1.9 and 0.4° C., respectively, as shown in FIG. 7. From the temperature differences A and B, the thermal resistance of the solder was calculated as 0.95 cm²·K/W.

Accordingly, it is seen that the thermal resistance in the case of using the carbon sheet as the adhesive substance 57 is about ⅙ times as much as that in the case of using the solder. This indicates that the cooling efficiency of the LEDs 33 can be significantly improved.

The solder used in the above experiment is an improved product whose temperature in the adhering process and pressure in the pressing process or the like are optimized. The thermal resistance of a typical solder is 2.3 cm²·K/W. As a result, the thermal resistance of the carbon sheet used in the above experiment is about 1/14 times as much as that of the typical solder.

The cooling plate 4a(4b) and the thermal diffusion member 50 on the rear side of the LED array 34 are fixed by using screws with a high thermal conductive adhesive substance 58 interposed therebetween. A silicone grease can be employed as the adhesive substance 58.

With such configuration, a cold heat that is high-efficiently transferred from a cooling medium to the high thermal conductive cooling plate 4a(4b) approaches the LEDs 33 via the high thermal-conductive thermal diffusion member 50, the supporter 32, and the electrodes 35, the thermal diffusion member 50 being in contact with the cooling plate 4a(4b) at the entire surface thereof. In other words, a heat generated from the LEDs 33 can efficiently be discharged to the cooling member 4a(4b) cooled by the cooling medium through high thermal conductive members, i.e., the high thermal conductive adhesive substance 56, the electrodes 35, the supporter 32, the high thermal conductive adhesive substance 57, the thermal diffusion member 50, and the high thermal conductive adhesive substance 58.

One LED 33 and the electrode 35 of the next LED are connected to each other by a wire 36. Reflection layers 59 containing, e.g., $TiO_2$ are provided at portions on the surface of the supporter 32 where no electrode 35 is placed. The reflection layer 59 serves to reflect a light emitted from the LED 33 toward the supporter 32 to be efficiently obtained. The reflection layer 59 has a reflectivity of 0.8 or more.

A reflecting plate 55 is provided between the adjacent LED arrays 34. Accordingly, the whole peripheries of the LED arrays 34 are surrounded by the reflecting plates 55. For example, a gold-plating copper plate may be employed as the reflecting plate 55. The reflecting plate 55 serves to reflect a light that travels in the horizontal direction such that the light can efficiently be obtained.

Each of the LEDs 33 is covered with a lens layer 20 made of a transparent resin. The lens layer 20 serves to obtain a light emitted from the LED 33. By using the lens layer 20, it is possible to obtain a light emitted from a side surface of the LED 33. As long as the lens layer 20 has a lens function, the shape of the lens layer 20 is not limited. However, the lens layer 20 preferably has a hemisphere shape in consideration of the easy manufacture and the efficiency. The refractive index of the lens layer 20 is in the range between the refractive index 1 of the air and the high refractive index of the LED 33. The lens layer 20 is provided to reduce the total reflection caused by the direct emission of light from the LED 33 to the air.

A space between the supporter 32 and the light-transmitting member 18a(18b) is exhausted to a vacuum level, and the opposite sides (upper portion and lower portion) of the light-transmitting member 18a(18b) become in a vacuum state. Accordingly, the light-transmitting member 18a(18b) may get thinner as compared with the case that the light-transmitting member 18a(18b) serves as a partition between an atmosphere state and a vacuum state.

Control boxes 37a and 37b for controlling the power supplied to the LEDs 33 are respectively provided at an upper side of the cooling member 4a and a lower side of the cooling member 4b. The control boxes 37a and 37b are connected to a power supply (not shown) through wires to control the power supplied to the LEDs 33.

Meanwhile, as shown in the enlarged view of FIG. 9, a power supply electrode 51 is inserted into holes 50a and 32a respectively formed in the thermal diffusion member 50 and the supporter 32, and the power supply electrode 51 is connected to the electrode 35 by soldering. An electrode bar 38 extending through the inside of the cooling member 4a(4b) is connected to the power supply electrode 51 via an attachment port 52. A plurality of, e.g., 8, electrode bars (only 2 electrode bars 38 are shown in FIG. 9) are provided for each of the LED arrays 34. The electrode bars are covered with a protection cover 38a made of an insulation material. The electrode bars 38 extend to an upper end portion of the cooling member 4a and a lower end portion of the cooling member 4b, respectively, and receiving members 39 are fixed at the upper end portion of the cooling member 4a and the lower end portion of the cooling member 4b, respectively, by using screws.

An insulation ring 40 is interposed between the receiving member 39 and the cooling member 4a(4b). Here, gaps between the protection cover 38a and the cooling member 4a(4b) and between the protection cover 38a and the electrode bar 38 are soldered, constituting a so-called feedthrough.

As shown in FIG. 1, a plurality of control boards 42 is provided in the control box 37a(37b). The control board 42 includes a connecting member 42a to which a power supply member 41 corresponding to the electrode bar 38 is connected; and a power supply connector 43 connected to the power supply by wires.

As shown in FIG. 9, the downwardly extending power supply member 41 is connected to the receiving member 39 attached to each of the electrode bars 38.

A pogo pin (spring pin) 41a is provided at a leading end portion of the power supply member 41. By bringing each of the pogo pins 41a into contact with the corresponding receiving member 39, a power is supplied from the control box 37a(37b) to each of the LEDs 33 via the power supply member 41, the electrode bar 38, the power supply electrode 51 and the electrode 35 of the heating source 17a(17b). In this way, a power is supplied to the LEDs 33 and, thus, the LEDs 33 emits lights. The wafer W is heated from the top and the bottom surface thereof by the emitted lights, to thereby perform the annealing process.

The pogo pin 41a is biased by a spring toward the receiving member 39. Accordingly, even when the control board 42 is dislocated, it is possible to reliably bring the power supply member 41 into contact with the electrode bar 38.

In FIG. 1, the power supply member 41 is partially shown and the electrode bar 38, the power supply electrode and the connection portions thereof are omitted. Moreover, the power supply electrode 51 is omitted in FIG. 2.

Figure 10:
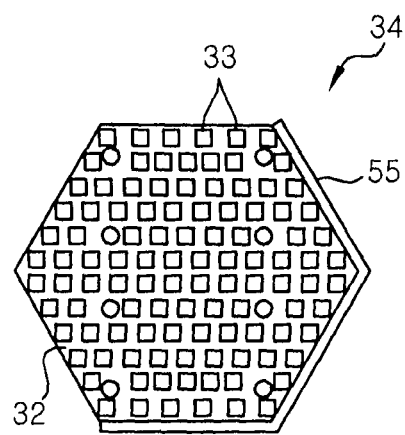
FIG. 10 shows an LED array of the annealing apparatus shown in FIG. 1.
Figure 11:
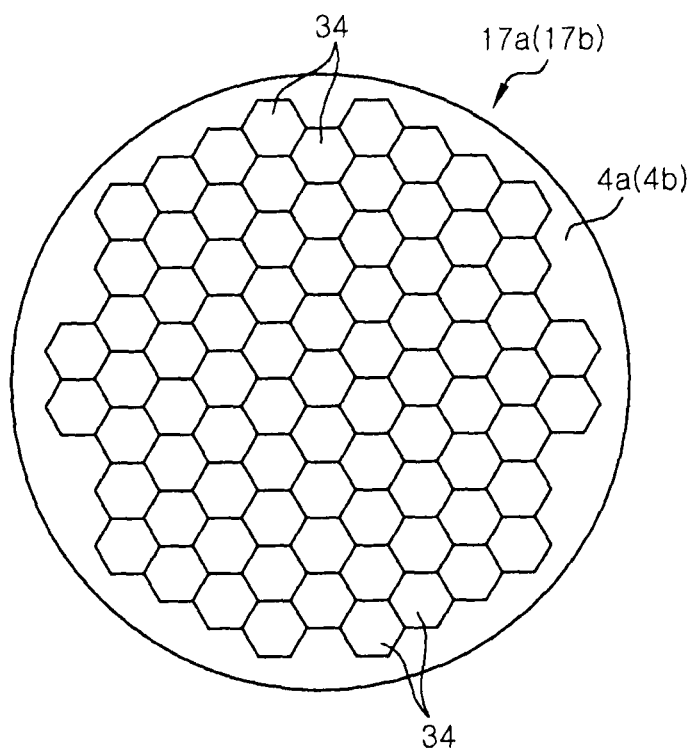
FIG. 11 is a bottom view showing a heating source of the annealing apparatus shown in FIG. 1.

As shown in FIG. 10, the LED arrays 34 have a hexagonal shape, and the reflecting plate 55 is provided on three sides of the hexagonal shape. The LED arrays 34 are compactly arranged as shown in FIG. 11, for example. At this time, the LED arrays 34 are arranged such that one side of an LED array 34 where no reflecting plate 55 is provided directly faces one side of an adjacent LED array 34 where the reflecting plate 55 is provided, so that all the LED arrays 34 are surrounded by the reflecting plates 55. Accordingly, the number of the arranged LED arrays 34 can be maximized without overlapping of the reflecting plates 55.

About 1000 to 2000 LEDs are mounted in one LED array 34. As for the LEDs 33, LEDs capable of emitting lights having wavelengths in the range from an ultraviolet light to a substantially infrared light, preferably, from 0.36 to 1.0 μm, are used. The LEDs which emit such lights having the wavelength between 0.36 to 1.0 μm may be made of a compound semiconductor based on GaN, GaAs, GaP or the like, for example. Especially, the LEDs are preferably made of a GaAs-based material to have emission wavelengths from around 950 to 970 nm with high absorptance for the wafer W made of silicon serving as a target to be heated.

As shown in FIG. 1, each component of the annealing apparatus 100 is controlled by being connected to a process controller 60 equipped with a microprocessor (computer). For example, the power supply control of the control boxes 37a and 37b, the control of a driving unit, the gas supply control, and the like are performed by the process controller 60. Connected to the process controller 60 is a user interface 61 having a keyboard by which an operator inputs commands or the like to manage the annealing apparatus 100 and a display unit for visualizing and displaying an operation status of the annealing apparatus 100, or the like. Further, a storage unit 62 is connected to the process controller 60, the storage unit 62 being capable of storing a program for performing various operations in the annealing apparatus 100 under the control of the process controller 60 and a program, i.e., a processing recipe, for performing the processes of the components of the annealing apparatus 100 according to the processing conditions. The processing recipe is stored in a storage medium (not shown) of the storage unit 62. The storage medium may be a fixed unit such as hard disk drive and a portable unit such as a CDROM, a DVD, and a flash memory. In addition, the recipe may adequately be transmitted from another device through, e.g., a dedicated line.

Moreover, an instruction is received, as necessary, from the user interface 61 and a corresponding processing recipe is called from the storage unit 62 to be executed by the process controller 60, to thereby perform a desired operation in the annealing apparatus 100 under the control of the process controller 60.

Next, the orders of assembling the LED arrays 34 and the cooling member 4a(4b) and mounting the LED arrays 34 will be described with reference to FIGS. 12A to 12J.

Figure 12A:
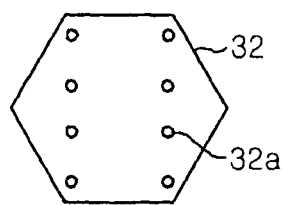
FIGS. 12A to 12j show the orders of assembling an LED array and a cooling member and mounting the LED array in the annealing apparatus shown in FIG. 1.

First, the hexagonal-shaped supporter 32 is obtained by cutting an AlN plate; forming the through holes 32a through which a power supply electrode and screws are inserted; and printing an electrode pattern (not shown) thereon (FIG. 12A).

Figure 12B:
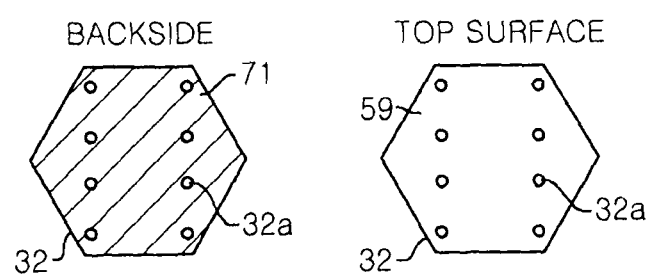

Then, a copper plating 71 is carried out on a rear surface of the supporter 32, and the reflection layer 59 containing $TiO_2$ is formed on a front surface of the supporter 32 at the other portions than the electrode pattern (the electrode pattern is omitted in the drawing) (FIG. 12B).

Figure 12C:
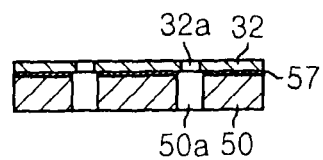
Figure 12D:
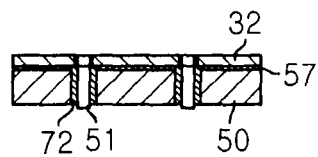

Next, a front surface of the thermal diffusion member made of copper with the same shape as that of the supporter 32 is adhered to the rear surface of the supporter 32 by using the high thermal conductive adhesive substance 57, through holes 50a being formed in the thermal diffusion member 50 to correspond to the through holes 32a (FIG. 12C). A paste-like solder may preferably be employed as the adhesive substance 57. The power supply electrode 51 is inserted through the though holes 32a and 50a of the supporter 32 and the thermal diffusion member 50; gaps therebetween are filled with the epoxy resin 72 and the vacuum sealing is performed thereon; and the heat treatment is performed on the solder and the resin in a continuous furnace (FIG. 12D). The vacuum sealing is typically performed by using a solder. Since, however, the sealing is performed in the vacuum processing space 1, it can sufficiently be performed by using the epoxy resin more inexpensively as compared with the case of using a solder.

Figure 12E:
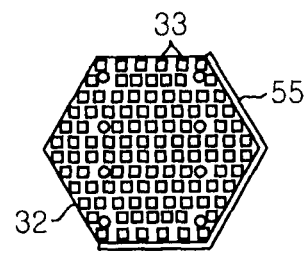
Figure 12F:
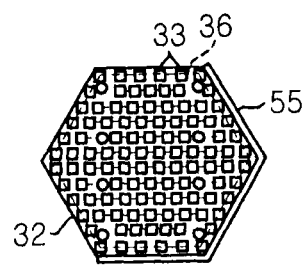

Thereafter, the high thermal conductive adhesive substance 56 is applied to the front surface of the supporter 32 (see FIG. 2). Then, the LEDs 33 are mounted on the applied adhesive substance 56 by a die bonder while the reflecting plate 55 is attached to three sides of the supporter 32 (FIG. 12E). In this case, in case a silver paste is employed as the adhesive substance 56, the silver paste is covered on the electrodes 35 and, then, it is hardened by being heated. As described above, another substance such as a solder may be employed as the adhesive substance 56 and the thermal stress buffer layer 80 may be interposed therebetween. Thereafter, by using the die bonder, the wires 36 are bonded to the electrodes 35 (FIG. 12F).

Figure 12G:
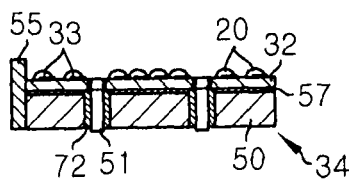
Figure 12H:
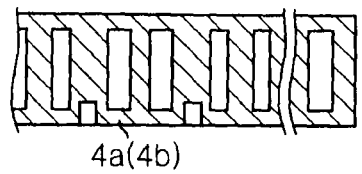

Next, the lens layer 20 made of a transparent resin is coasted on the LEDs 33, and the LED arrays 34 are completed (FIG. 12G). In the meantime, the cooling member 4a(4b) made of aluminum is assembled (FIG. 12H) while the LED arrays 34 are completed.

Figure 12I:
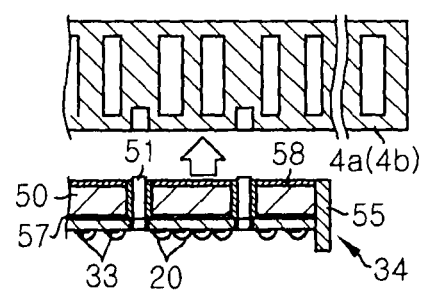
Figure 12J:
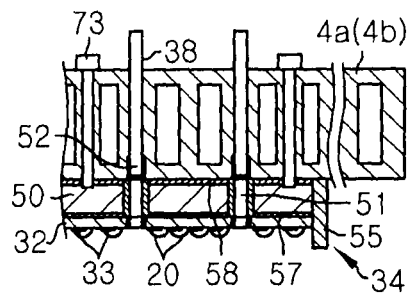

Thereafter, the high thermal conductive adhesive substance 58 made of, e.g., a silicone grease is covered on the thermal diffusion member 50, and the LED arrays 34 are mounted on the cooling member 4a(4b) (FIG. 12I). Then, the power supply member 38 is connected to the power supply electrode 51 and the LED arrays 34 are fixed by using the screws 73 (FIG. 12J).

In this way, the mounting of the LED arrays 34 is completed and, then, the light-transmitting members 18a and 18b are attached thereto.

Next, the annealing process of the annealing apparatus 100 will be described.

First, the gate valve 13 is opened, and the wafer W is loaded through the loading/unloading port 12 to be mounted on the supporting member 7. Then, the gate valve 13 is closed to seal the processing space 1 into a sealed state. Moreover, the processing space 1 is exhausted, via the gas exhaust line 11, by the gas exhaust unit (not shown) while a predetermined processing gas, e.g., argon gas or nitrogen gas, is introduced from the processing gas supply unit (not shown) into the processing gas 1 via the processing gas line 9 and the processing gas inlet opening 8 to maintain the pressure of the processing space 1 at a predetermined level between, e.g., 100 and 10000 Pa.

Meanwhile, the cooling members 4a and 4b respectively include the coolant flow paths 21a and 21b, through which a liquid cooling medium flows so as to cool the LEDs 33 to a predetermined temperature of 0° C. or less, preferably, −50° C. or less. For example, a fluorine-based nonreactive liquid (Trademark name:, e.g., Florinert or Galden) is used as the liquid cooling medium.

A predetermined current is supplied from the power supply (not shown) to the LEDs 33 via the control box 37a(37b), the power supply members 41, the electrode bar 38, and the electrodes 35 so as to turn on the LEDs 33.

Lights emitted from the LEDs 33 directly travel through the lens layer 20 or are reflected by the reflection layer 59 to travel through the lens layer 20. Then, the lights travel through light-transmitting member 18a(18b), and the wafer W is heated very rapidly by using the electromagnetic radiation caused by the recombination between electrons and holes.

At a room temperature, the light emission amount of the LEDs 33 is reduced by the heat emission of the LEDs 33, or the like. However, in the present embodiment, a cooling medium flows through the cooling member 4a(4b) and the LEDs 33 are cooled via the thermal diffusion member 50, the supporter 32, and the electrodes 35. Accordingly, the LEDs 33 can be cooled efficiently.

The present inventors have proposed a technique for efficiently cooling LEDs by using high conductive copper for the cooling members 4a and 4b and the thermal diffusion members 50 (Japan Patent Application No. 2007-081609 (Japan Patent Application publication No. 2008-227435)). Since, however, the cooling member 4a(4b) made of copper is too heavy, it is difficult to obtain sufficient maintenance.

Accordingly, in the present embodiment, the cooling member 4a(4b) is made of aluminum or aluminum alloy to reduce its weight without reducing the cooling efficiency. Since aluminum is less thermal conductive than copper, it is difficult to sufficiently cool the LEDs by interposing aluminum therebetween. However, from the research results of the present inventors, it is clear that, since the wafer is sufficiently heated by the LEDs for several seconds only, the LEDs can satisfactorily be cooled by the cold heat accumulated in the thermal diffusion member 50 made of copper. Accordingly, even when the cooling member is made of aluminum, it is possible to cool the LEDs to the substantially same temperature level as that in the case that the cooling member and the thermal diffusion member are made of copper.

Actually, the annealing process was performed at 10 cycles under the following four conditions to measure a highest attainable temperature of the supporter 32. Condition 1: the LEDs are cooled via the supporter by using the combination of the cooling member made of aluminum and the thermal diffusion plate made of copper and having a thickness of 5 mm; Condition 2: the LEDs are cooled via the supporter by using the combination of the cooling member made of copper and the thermal diffusion plate made of copper and having a thickness of 5 mm; Condition 3: the LEDs are cooled via the supporter by using the combination of the cooling member made of aluminum and the thermal diffusion plate made of aluminum and having a thickness of 5 mm; and Condition 4: the LEDs are cooled via the supporter by using only the cooling member made of copper.

As a result, the highest attainable temperature in the case of condition 1 is in the range between about 30° C. (first cycle) and 50° C. (tenth cycle), which is the substantially same as those in the case of conditions 2 and using copper only. On the other hand, the highest attainable temperature in the case of condition 3 using aluminum only is in the range between about 70° C. (first cycle) and 95° C. (tenth cycle). Resultantly, it is confirmed that, by using the aluminum cooling member and the copper thermal diffusion member, it is possible to obtain the substantially same cooling efficiency as that in the case of using all copper products.

Moreover, since the LED arrays 34 are unitized and attached to the cooling member 4a(4b) by using screws 73 via the silicone grease 58, the LED arrays 34 can easily be mounted and separated and, thus, the LEDs 33 can easily be replaced.

Since, as described above, the LED arrays 34 are easily replaced and the cooling member is made of aluminum or aluminum alloy that is less heavy than copper, it is possible to obtain the high maintenance thereof.

Further, the supporter 32 made of aluminum nitride and the thermal diffusion member 50 made of copper are brought into surface-contact with each other by using the solder 57, and the thermal diffusion member 50 and the cooling member 4a(4b) are brought into surface-contact with each other by using the high thermal conductive silicone grease 58. Accordingly, it is possible to obtain the low thermal resistance and the high cooling efficiency.

Figure 13:
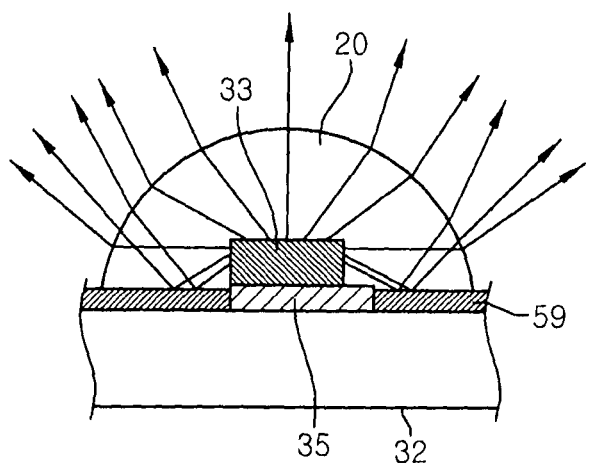
FIG. 13 shows how a light is obtained when a lens layer and a reflection layer are provided in the LED.

In the present embodiment, as described above, a light emitted from the LEDs 33 directly travels through the lens layer 20 or is reflected by the reflection layer 59 to travel through the lens layer 20. Then, the light travels through light-transmitting member 18a(18b). FIG. 13 shows the traveling routes of the light. Specifically, lights downwardly emitted from the LEDs 33 are reflected by the white-colored reflection layer 59 containing, e.g., $TiO_2$. The reflection layer 59 preferably has the reflectivity of 0.8 or more to improve the obtaining efficiency of the lights emitted from the LEDs 33.

Further, by providing the lens layer 20, it is possible to effectively obtain the lights laterally emitted from the LEDs 33. Moreover, since the lens layer 20 is made of a transparent resin and has a refractive index between an outer space of the lens and the LED 33, so that the refractive index becomes decreased in the order of the LED 33, the lens layer 20 and the outer space. Accordingly, the total reflection hardly occurs and, thus, it is difficult to deteriorate the efficiency.

The reflectivity of aluminum nitride is about 0.2. Accordingly, when no reflection layer 59 is provided, the lights emitted from the LEDs 33 that arrive at the supporter 32 made of aluminum nitride are mostly absorbed, so that it is difficult to effectively obtain the lights. For that reason, even though the lens layer 20 only is provided without the reflection layer 59, the multiple reflection occurs at the lens layer 20 and some lights are absorbed by the supporter 32 made of aluminum nitride. Therefore, the actual light-obtaining efficiency is not significantly increased.

However, it is possible to increase the light-obtaining efficiency by providing the reflection layer 59. Further, by providing both the reflection layer 59 and the lens layer 20, it is possible to increase the light-obtaining efficiency much more by their synergy effect.

Actually, when a current of 50 mA was supplied to an LED made of GaAs with the size of 0.5 mm×0.5 mm, the output of a light emitted from the LED was measured under the following four conditions by using an integrating sphere. Condition 1: no reflection layer and no lens layer are used; Condition 2: no reflection layer and the lens layer are used; Condition 3: the reflection layer and no lens layer are used; and Condition 4: the reflection layer and the lens layer are used. The measured results are shown in FIG. 14.

Figure 14:
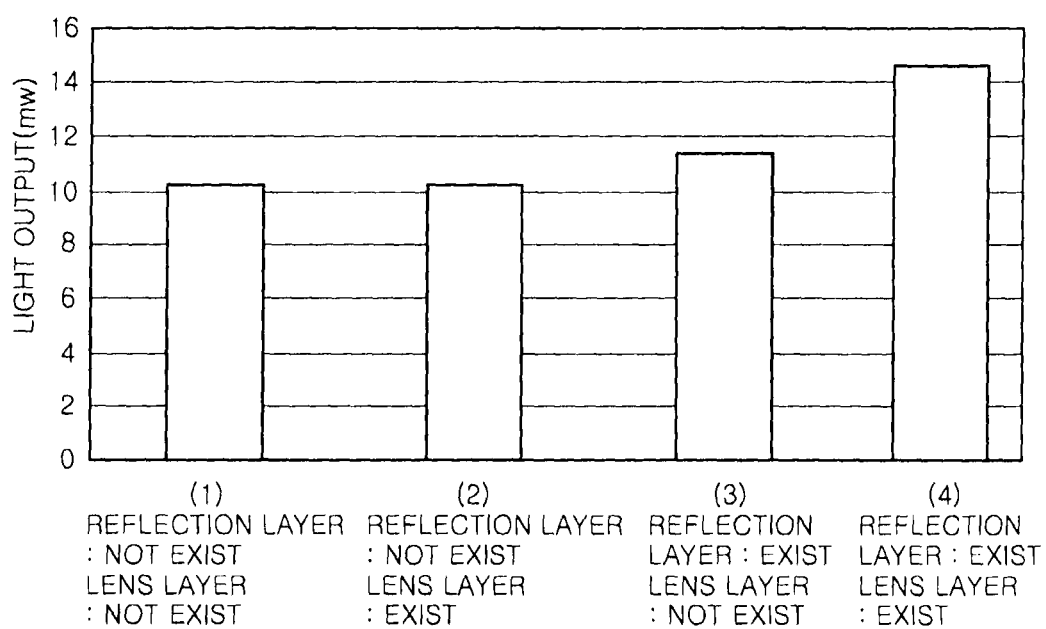
FIG. 14 shows a light output depending on whether or not there exist a reflection layer and a lens layer.

As shown in FIG. 14, the light output is slightly increased under the condition 2 using the lens layer only as compared with the condition 1 using no reflection layer and no lens layer; on the other hand, the light output is increased by about 15% under the condition 3 using the reflection layer only and the light output is increased by about 45% by the synergy effect under the condition 4 using the reflection layer and the lens layer.

Preferably, a white-colored reflection layer made of $TiO_2$ is employed as the reflection layer 59 to obtain the high reflectivity. Further, it is preferable to reduce transmitting lights in the reflection layer so as to obtain a higher reflectivity. Accordingly, the reflection layer 59 preferably has the thickness of about 80 μm or more.

Actually, a relationship between the reflectivity and the wavelength of a light was acquired by using a high reflectivity white-colored development type solder resist (PSR-4000 LEW1) made by Taiyo Ink Mfg Ltd., which contains $TiO_2$, while changing the thickness of the solder resist to 15, 45, and 85 μm. The results are shown in FIG. 15.

Figure 15:
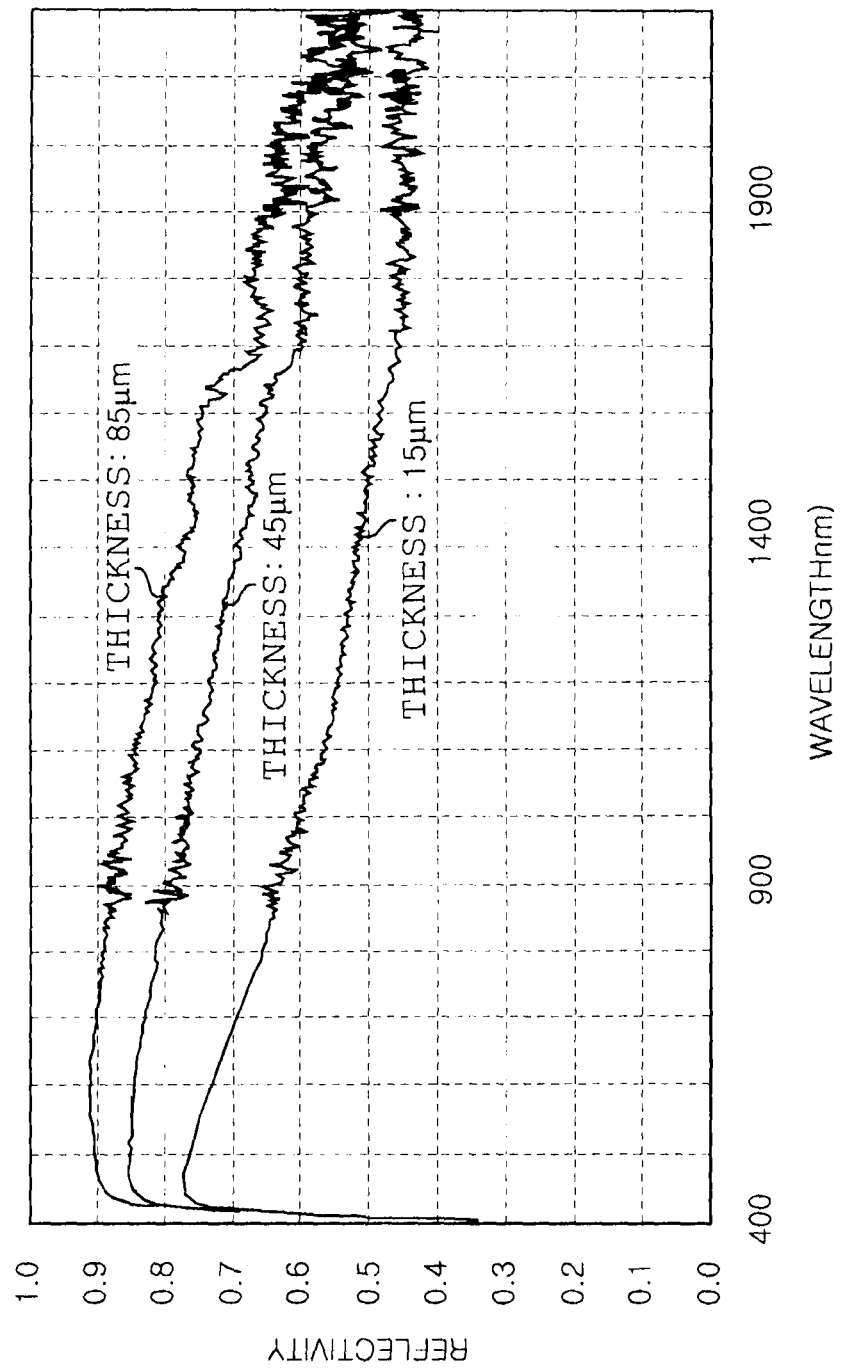
FIG. 15 shows a relationship between a wavelength and a reflectivity of a light when the thickness of a reflection layer is set as 15, 45, and 85 µm.

As shown in FIG. 15, it is seen that, in case that the thickness of the reflection layer 59 is 85 μm, a light having the wavelength of about 900 nm necessary to heat the silicon has a high reflectivity of about 0.9. Moreover, as the thickness of the reflection layer 59 gets thinner, the reflectivity becomes reduced. Specifically, in the case of 45 and 15 μm, the reflectivity becomes about 0.8 and 0.65, respectively. From this result, it is clear that the reflectivity reliably becomes 0.8 or more as the thickness is increased to 45 μm or more, preferably 80 μm or more. In addition, the reflection layer 59 is preferably thinner than the electrode 35. Accordingly, an upper limit of the thickness of the reflection layer 59 is determined as about 100 μm.

Moreover, the lights that are emitted from the LEDs 33 and arrive at the reflecting plate 55 can be reflected by the reflecting plate 55 at a high reflection rate. Accordingly, the light-obtaining efficiency of the LEDs 33 can be increased. In addition, the reflecting plate 55 may be provided at only three sides of each of the LED arrays 34 and the LED arrays 34 are arranged such that one side of an LED array 34 where no reflecting plate 55 is provided is adjacent to one side of another LED array 34 where the reflecting plate 55 is provided, so that the arranged LED arrays 34 are surrounded by the reflecting plates 55 without the overlapping of the reflecting plates 55. Accordingly, the reflecting plates 55 can efficiently be provided with the significant large arrangement area of the LEDs 33.

In the conventional annealing apparatus using the LEDs, the pressure difference between the vacuum pressure of the processing space and the atmosphere pressure of the LED space is applied to the light-transmitting member. Accordingly, the light-transmitting member is required to have a thick thickness. However, in the present embodiment, the pressure difference between the processing space and the atmosphere is applied to the cooling members 4a and 4b made of a metal material. Accordingly, the light-transmitting members 18a and 18b can be made thin. By making thinner the light-transmitting members 18a and 18b, it is possible to suppress a heat from being accumulated in the light-transmitting members 18a and 18b.

Therefore, it is possible to obtain a thermal insulation efficiency between a part cooled through the cooling member 4a(4b) and a heated part inside the processing space 1. The screws for fixing the light-transmitting members 18a and 18b may be made of a ceramic or a resin having a small thermal conductivity to improve such thermal insulation efficiency much more. Further, by making thinner the light-transmitting members 18a and 18b as described above, the heat can efficiently be radiated from the wafer W to the cooling member 4a(4b), making better the temperature decrease characteristics.

Moreover, by using aluminum nitride as a material of the supporters 32 of the LED arrays 34, it is possible to reflect lights having wavelengths emitted from the LEDs and absorb radiant heat from the wafer W heated at a temperature of about 1000° C., making better the temperature increase or decrease characteristics.

Next, another embodiment of the present invention will be described.

FIG. 16 is a cross sectional view showing a heating source in accordance with another embodiment. The annealing apparatus of the present embodiment has a substantially same configuration as that of the previous embodiment except for using a thermal diffusion member 150 made of pyrolytic graphite (PG) serving as a high thermal conductive material.

PG is produced by depositing carbon in a graphite structure by chemical vapor deposition (CVD) using hydrocarbon gas. PG features the anisotropic thermal conductivity. Specifically, PG has a significantly high thermal conductivity of 2000 W/m·K or more in the in-plane direction of a deposited film, which is 3 times as high as that of copper and, on the other hand, a lower thermal conductivity of 20 W/m·K or less in the film thickness direction. Accordingly, it is possible to significantly increase the thermal conductivity of a heat transfer route by setting the thickness direction of the thermal diffusion member 150 to be identical to a direction in which the thermal conductivity of PG is high.

In addition, the volumetric specific heat of copper is 3500 kJ/m³·K, while that of PG is 1650 kJ/m³·K. The volumetric specific heat is obtained by using density and specific heat. Since the thermal capacity is in proportion to the volumetric specific heat, the thermal capacity of PG is ½ times as much as that of copper. Accordingly, if both the thermal conductivity and the thermal capacity are applied, it is possible to increase the cooling efficiency of the LEDs 33 much more by using the thermal diffusion member 150 made of PG.

A method for forming the thermal diffusion member 150 by setting the thickness direction thereof to be identical to the direction in which the thermal conductivity of PG is high will be described with reference to FIGS. 17A to 17C.

Figure 17A:
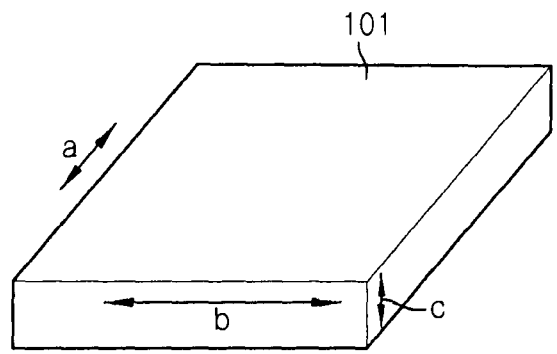
FIG. 17A shows a method for making a thermal diffusion member 150 whose thickness direction is set to be identical to a direction in which thermal conductivity pyrolytic graphite is high.
Figure 17B:
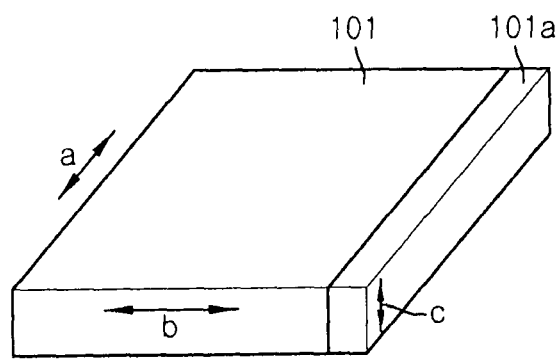
FIG. 17B shows another method for making a thermal diffusion member 150 whose thickness direction is set to be identical to a direction in which a thermal conductivity of pyrolytic graphite is high.
Figure 17C:
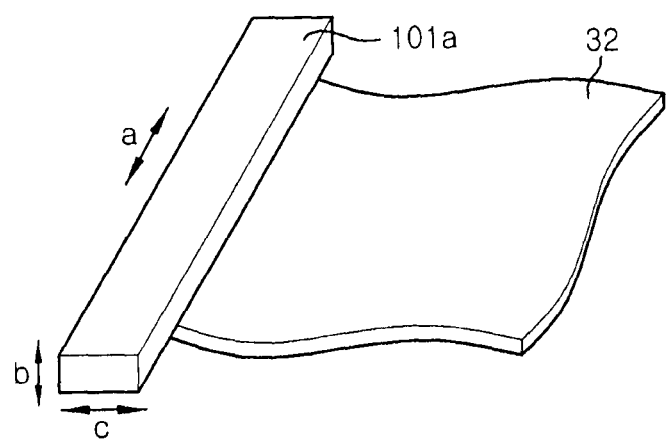
FIG. 17C shows still another method for making a thermal diffusion member 150 whose thickness direction is set to be identical to a direction in which a thermal conductivity of pyrolytic graphite is high.

First, a thick PG film 101 is formed by CVD as shown in FIG. 17A. In the PG film 101, two in-plane directions perpendicular to each other are referred to as directions "a" and "b", respectively, and a thickness direction is referred to as a direction "c". Then, a sliced part 101a is made by slicing the PG film 101 in the direction "a" to have a predetermined thickness while the thickness of the PG film 101 is maintained as shown in FIG. 17B, and the sliced part 101a is attached to the supporter 32 such that the direction "b" becomes the thickness direction of the sliced part 101a as shown in FIG. 17C. Such sliced parts 101a are attached to the supporter 32 so as to cover the entire surface of the supporter 32. Then, the sliced parts 101a are machined to have a shape of the supporter 32.

The adhering of the thermal diffusion member 150 may be performed by using the same resin as an epoxy resin. Since PG has high porosity, the adhering between the thermal diffusion member 150 and the supporter 32 may be performed by a resin while the contact therebetween is maintained. Accordingly, it becomes unnecessary to use a high thermal conductive adhesive substance as in the previous embodiment.

As described above, the thermal diffusion member 150 made of PG is employed and the direction in which the thermal conductivity of PG is high is set to be identical to the direction in which a cold heat is moved (thickness direction of the thermal diffusion member 150). Accordingly, it is possible to quickly accumulate the cold heat in the thermal diffusion member 150 and sufficiently cool the LEDs 33 by using the accumulated cold heat. Moreover, since the specific gravity of PG is about ¼ times as much as that of copper, it is possible to reduce the weight of the thermal diffusion member 150, improving the maintenance much more, as compared with that in the previous embodiment.

Figure 18:
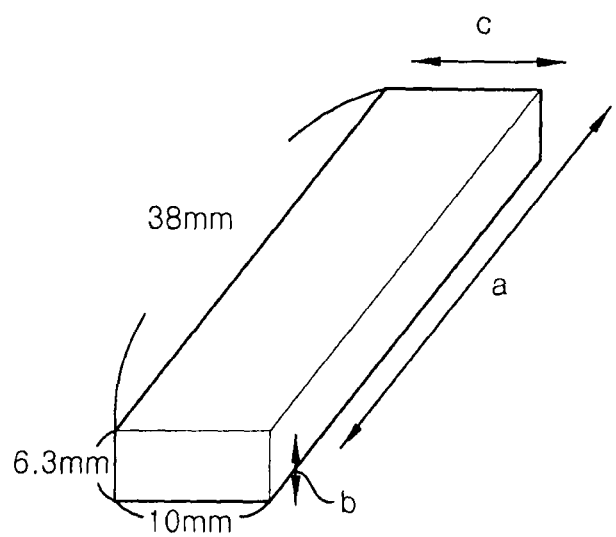
FIG. 18 is a perspective view showing a sample used for measuring a thermal conductivity of pyrolytic graphite.

Then, measurement results of the thermal conductivity of PG will be described. Here, a rectangular parallelepiped sample of 38×10×6.3 mm is made by forming a PG film of 38×38×10(thickness) mm and slicing the PG film in the width of 6.3 mm as shown in FIG. 18. The direction of the longer side of 38 mm is the direction "a" and the direction of the side of 10 mm is the direction "c". The direction of the side of 6.3 mm is the direction b.

Figure 19:
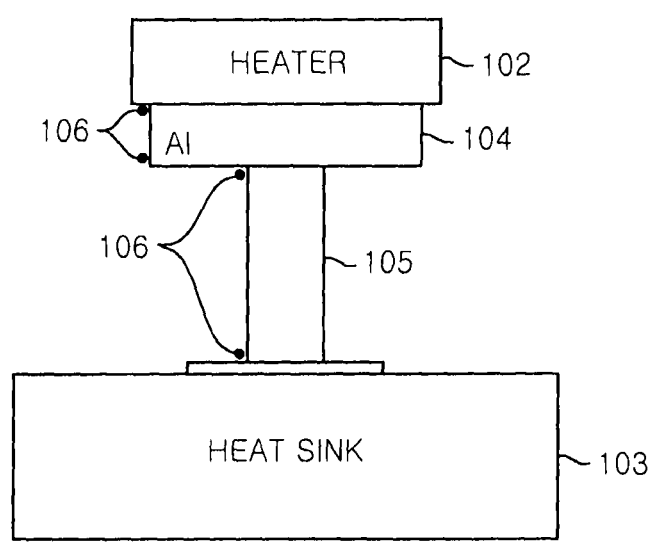
FIG. 19 shows a method for measuring a thermal conductivity.
Figure 20:
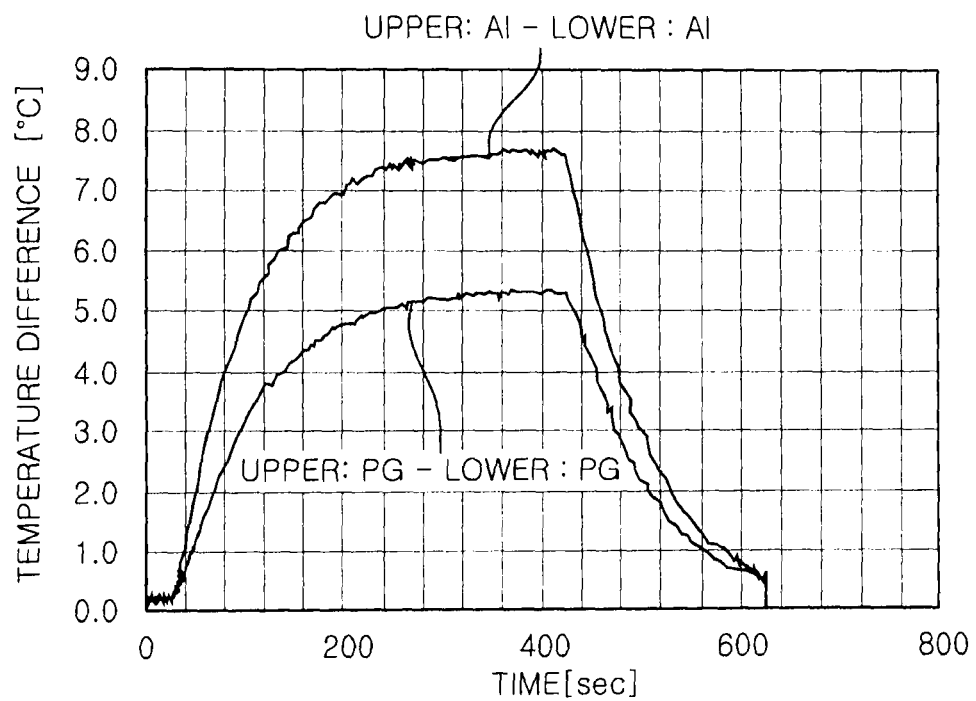
FIG. 20 is a chart showing a temperature difference between an upper and a lower portion of an Al plate and a temperature difference between an upper and a lower portion of a pyrolytic graphite sample to measure a thermal conductivity of pyrolytic graphite.

As shown in FIG. 19, to measure the thermal conductivity of, e.g., the direction "a", an Al plate 104 having a thickness of 4 mm and such a PG sample 105 are interposed between the heater 102 and the heat sink 103 such that the direction "a" of the PG sample 105 becomes the vertical direction. Then, thermocouples 106 are provided at an upper and a lower location of the Al plate 104 and an upper and a lower location of the PG sample 105, i.e., at the total four locations. Then, a temperature difference C between the upper and the lower location of the Al plate 104 and a temperature difference D between the upper and the lower location of the PG sample 105 are measured when they are heated by the heater 102. In addition, the distance between the thermocouple locations of the sample 105 is set to be 36 mm. The relationship between the temperature heated by the heater and the temperature differences C and D are shown by FIG. 20, where the temperature differences C and D are 7.7 and 5.3° C., respectively.

The heat flux Q from the heater 102 to heat sink 103 is computed as 24.3 W from the temperature difference between the upper and the lower location of the Al plate 104. The thermal conductivity of PG is computed as 2620 W/m·K from the heat flux Q and the temperature difference between the upper and the lower location of the PG sample 105. In other words, the thermal conductivity of the direction "a" of the PG sample 105 is 2620 W/m·K.

In similar ways, the thermal conductivities of the directions "b" and "c" are 2100 and 16 W/m·K, respectively. Accordingly, it is seen that the LEDs 33 can efficiently be cooled by a cold heat supplied to the LEDs 33 by setting the thickness direction of the thermal diffusion member 150 to be identical to the direction in which the thermal conductivity of PG is high.

The present invention is not limited to the above embodiments, and various modifications are possible. For example, in the above embodiments, the heating sources having LEDs are provided on the opposite sides of the wafer serving a target substrate to be processed. However, the heating source may be provided on one side of the wafer. Moreover, in the above embodiments, the LED arrays are fixed to the cooling member by using screws. However, the fixing method is not limited to the method using the screws. In the above embodiments, the LEDs are employed as the light emitting elements. Other light emitting elements such as semiconductor laser emitting elements may alternatively be used. The target substrate to be processed may be a glass substrate for FPD without being limited to the semiconductor wafer.

The present invention may preferably be used for the case of requiring the high-speed heating, for example, the annealing processing on the semiconductor wafer after impurities are injected.

While the invention has been shown and described with respect to the embodiments, it will be understood by those skilled in the art that various changes and modifications may be made without departing from the scope of the invention as defined in the following claims.

What is claimed is:
1. An annealing apparatus comprising:
a plurality of light emitting diode (LED) arrays;
a cooling member to which the LED arrays are fixed and made of aluminum or aluminum alloy;
a cooling unit configured to cool the cooling member by using a cooling medium; and
a plurality of reflection plates,
wherein each of the LED arrays is constituted as a single unit including
a plurality of light emitting elements configured to emit lights to a target substrate to be processed,
a supporter having a first surface on which the light emitting elements are mounted and a second surface opposite to the first surface, wherein the light emitting elements are mounted on the first surface by using a high thermally conductive first adhesive substance, and the supporter is made of a high thermally conductive second insulating material,
a thermal diffusion member adhered to the second surface of the supporter by using a high thermally conductive second adhesive substance, the thermal diffusion member being made of copper,
a reflection layer formed on the first surface of the supporter, and
plural lens layers respectively covering the light emitting elements, wherein the LED arrays are fixed to the cooling member via a high thermally conductive third adhesive substance, and wherein, for a first LED array and a second LED array each of which comprising said single unit, a first reflection plate and a second reflection plate of the plurality of the reflection plates are respectively provided only along first and second sides of the first and second LED arrays, said first reflection plate is provided along at least one peripheral edge of the first LED array in a position adjacent a side of the second LED array where no reflection plate is provided.

2. The annealing apparatus of claim 1, wherein the second adhesive substance is a solder.

3. The annealing apparatus of claim 1, wherein the second adhesive substance is a carbon sheet in which a plurality of vapor deposition carbon fibers is oriented in a thickness direction thereof in a base resin made of a thermoplastic resin.

4. The annealing apparatus of claim 3, wherein the vapor deposition carbon fibers have a carbon nano tube structure.

5. The annealing apparatus of claim 1, wherein the supporter is made of aluminum nitride.

6. The annealing apparatus of claim 1, wherein the first adhesive substance for adhering the light emitting elements is a silver paste.

7. The annealing apparatus of claim 1, wherein the first adhesive substance for adhering the light emitting elements is a solder.

8. The annealing apparatus of claim 1, wherein each of the light emitting elements is adhered to an electrode patterned in the supporter and made of the high electrically and thermally conductive material by using the first adhesive substance.

9. The annealing apparatus of claim 8, wherein a plurality of layers including the first adhesive substance are provided between the light emitting elements and the electrode, serving as a thermal stress buffer structure.

10. The annealing apparatus of claim 9, wherein one or more thermal stress buffer layers are provided between the light emitting elements and the first adhesive substance.

11. The annealing apparatus of claim 10, wherein the first adhesive substance is a solder, and the thermal stress buffer layers are made of a material having a linear expansion coefficient that is in a range between those of the light emitting elements and the solder.

12. The annealing apparatus of claim 1, wherein the third adhesive substance interposed between the cooling member and the thermal diffusion member is a silicone grease.

13. An annealing apparatus comprising:
a plurality of light emitting diode (LED) arrays;
a cooling member to which the LED arrays are fixed and made of aluminum or aluminum;
a cooling unit configured to cool the cooling member by using a cooling medium; and
a plurality of reflection plates,
wherein each of the LED arrays is constituted as a single unit including
a plurality of light emitting elements configured to emit lights to a target substrate to be processed,
a supporter having a first surface on which the light emitting elements are mounted and a second surface opposite to the first surface, wherein the light emitting elements are mounted on the first surface by using a high thermally conductive first adhesive substance, and the supporter is made of a high thermally conductive insulating material,
a thermal diffusion member adhered to the second surface of the supporter by using a high thermally conductive second adhesive substance, the thermal diffusion member being made of pyrolytic graphite,
a reflection layer formed on the first surface of the supporter, and
plural lens layers respectively covering the light emitting elements,
wherein the LEDs array are fixed to the cooling member via a highly thermally conductive second adhesive substance;
wherein the thermal diffusion member is adhered to the second surface of the supporter such that a thickness direction of the thermal diffusion member is identical to a direction in which a thermal conductivity of the pyrolytic graphite is high, and
wherein, for a first LED array and a second LED array each of which comprising said single unit, a first reflection plate and a second reflection plate of the plurality of the reflection plates are respectively provided only along first and second sides of the first and second LED arrays, said first reflection plate is provided along at least one peripheral edge of the first LED array in a position adjacent a side of the second LED array where no reflection plate is provided.

14. The annealing apparatus of claim 13, wherein the thermal diffusion member and the supporter are adhered to each other by an epoxy resin.

15. The annealing apparatus of claim 13, wherein the supporter is made of aluminum nitride.

16. The annealing apparatus of claim 13, wherein the first adhesive substance for adhering the light emitting elements is a silver paste.

17. The annealing apparatus of claim 13, wherein the first adhesive substance for adhering the light emitting elements is a solder.

18. The annealing apparatus of claim 13, wherein each of the light emitting elements is adhered to an electrode patterned in the supporter and made of the high electrically and thermally conductive material by using the first adhesive substance.

19. The annealing apparatus of claim 18, wherein a plurality of layers including the first adhesive substance are provided between the light emitting elements and the electrode, serving as a thermal stress buffer structure.

20. The annealing apparatus of claim 19, wherein one or more thermal stress buffer layers are provided between the light emitting elements and the first adhesive substance.

21. The annealing apparatus of claim 20, wherein the first adhesive substance is a solder, and the thermal stress buffer layers are made of a material having a linear expansion coefficient that is in a range between those of the light emitting elements and the solder.

22. The annealing apparatus of claim 13, wherein the second adhesive substance interposed between the cooling member and the thermal diffusion member is a silicone grease.

23. The annealing apparatus of claim 1, wherein the reflection layer has a reflectivity of 0.8 or more.

24. The annealing apparatus of claim 1, wherein the reflection layer is a white-colored layer containing $TiO_2$.

25. The annealing apparatus of claim 24, wherein the reflection layer has a thickness of 0.8 μm or more.

26. The annealing apparatus of claim 1, wherein the lens layers are made of a transparent resin.

27. The annealing apparatus of claim 1, wherein the lens layers have a hemisphere shape.

28. The annealing apparatus of claim 1, wherein every two neighboring LED arrays commonly share one reflection plate.

29. The annealing apparatus of claim 28, wherein each supporter has a hexagonal shape having three sides at each of which a reflection plate is provided and the remaining three sides where no reflection plate is provided, and the LED arrays are arranged such that one side a supporter where a reflection plate is provided is disposed adjacent to one side of another supporter where no reflection plate is provided.

\* \* \* \* \*